(12) United States Patent
Meshot et al.

(10) Patent No.: US 12,439,763 B2
(45) Date of Patent: Oct. 7, 2025

(54) ELECTRICALLY GATED NANOSTRUCTURE DEVICES

(71) Applicant: Lawrence Livermore National Security, LLC, Livermore, CA (US)

(72) Inventors: Eric Meshot, Livermore, CA (US); Steven Buchsbaum, Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 664 days.

(21) Appl. No.: 17/170,685

(22) Filed: Feb. 8, 2021

(65) Prior Publication Data

US 2021/0249618 A1     Aug. 12, 2021

Related U.S. Application Data

(60) Provisional application No. 62/972,320, filed on Feb. 10, 2020.

(51) Int. Cl.
| | |
|---|---|
| *H10K 10/46* | (2023.01) |
| *G01N 27/414* | (2006.01) |
| *H10K 85/20* | (2023.01) |

(52) U.S. Cl.
CPC ....... *H10K 10/484* (2023.02); *G01N 27/4146* (2013.01); *H10K 10/481* (2023.02); *H10K 85/221* (2023.02)

(58) Field of Classification Search
CPC .. H10K 10/484; H10K 10/481; H10K 85/221; H10K 10/462; G01N 27/4146
USPC ........................................................ 257/288
See application file for complete search history.

(56) References Cited

U.S. PATENT DOCUMENTS

| | | | | |
|---|---|---|---|---|
| 2002/0162797 A1* | 11/2002 | Johnson | ..................... | H01F 1/36 |
| | | | | 210/695 |
| 2002/0162798 A1* | 11/2002 | Johnson | ..................... | H01F 1/36 |
| | | | | 210/660 |
| 2005/0079659 A1* | 4/2005 | Duan | ................ | H01L 29/78684 |
| | | | | 438/197 |
| 2009/0017605 A1* | 1/2009 | Lee | ......................... | H01L 31/18 |
| | | | | 257/E21.135 |
| 2009/0197706 A1* | 8/2009 | Yamada | ............. | A63B 37/0023 |
| | | | | 473/378 |
| 2010/0127242 A1 | 5/2010 | Zhou et al. | | |
| 2010/0207103 A1 | 8/2010 | Farrow et al. | | |

(Continued)

OTHER PUBLICATIONS

U.S. Appl. No. 62/797,063, filed Jan. 25, 2019, Lawrence Livermore National Security, LLC.

(Continued)

*Primary Examiner* — Nathan W Ha
(74) *Attorney, Agent, or Firm* — Foley & Lardner LLP

(57) ABSTRACT

Provided is a gated nanostructure device, which includes a thick film comprising a conducting nanoporous material between a source electrode and a drain electrode; and a gate electrode that modulates an electric current through the conducting nanoporous material between the source electrode and the drain electrode throughout a thickness of the thick film. The conducting nanoporous material includes an exposed portion, which is exposed to an external environment, and pores of the conducting nanoporous material are aligned at least partially between the source electrode and the drain electrode.

22 Claims, 11 Drawing Sheets

(56) References Cited

U.S. PATENT DOCUMENTS

Figure 1:
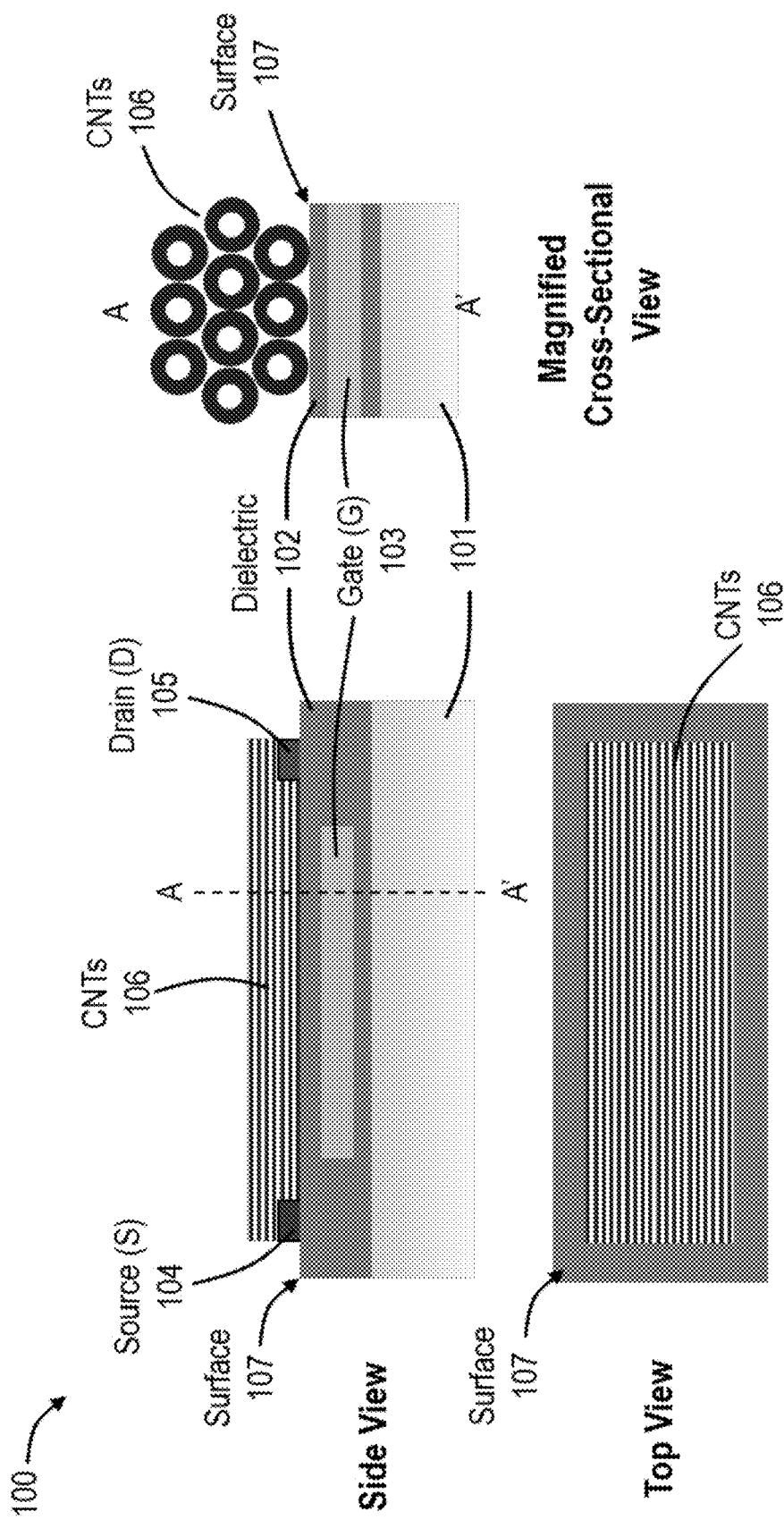

| | | |
|---|---|---|
| 2011/0017973 A1 | 1/2011 | Hong et al. |
| 2011/0147714 A1 | 6/2011 | Hong et al. |
| 2014/0116936 A1* | 5/2014 | Kim .................. B01D 71/021 977/890 |
| 2015/0129941 A1 | 5/2015 | Zhang et al. |
| 2018/0204898 A1 | 7/2018 | Li et al. |
| 2019/0018041 A1 | 1/2019 | Ilani et al. |
| 2020/0238284 A1 | 7/2020 | Meshot et al. |

OTHER PUBLICATIONS

PCT/US2020/015096, Jan. 24, 2020, Lawrence Livermore National Security, LLC.

M. De Volder, et al., "Strain-engineered manufacturing of freeform carbon nanotube microstructures", Nature Communications, vol. 5: 4512 (2014), pp. 1-9.

Meshot et al., "High-yield growth kinetics and spatial mapping of single-walled carbon nanotube forests at wafer scale", Carbon, vol. 159, pp. 236-246 (2020).

Mounet et al., "Two-dimensional materials from high-throughput computational exfoliation of experimentally known compounds", Nature Nanotechnology, vol. 13, pp. 246-252 (2018).

Nagata et al., "Isolation of Single-Wired Transition-Metal Monochalcogenides by Carbon Nanotubes", Nano Lett., 19, pp. 4845-4851 (2019).

Slade et al., "Unprecedented New Cystalline Forms of SnSe in Narrow to Medium Diameter Carbon Nanotubes", Nano Letters, 19, 2979-2984 (2019).

Xiang et al., "One-dimensional van der Waals heterostructures", Jan. 31, 2020, Science, 367, pp. 537-542.

Zhou et al., "A library of atomically thin metal chalcogenides", Apr. 19, 2018, Nature, vol. 556, pp. 355-359.

International Search report and Written Opinion on PCT Appl. Ser. No. PCT/US2021/017126 dated Jul. 9, 2021 (10 pages).

* cited by examiner

ELECTRICALLY GATED NANOSTRUCTURE DEVICES

CROSS-REFERENCE TO RELATED APPLICATIONS

This application claims priority under 35 U.S.C. § 119 (e) to U.S. Provisional Application No. 62/972,320, filed Feb. 10, 2020, which is hereby incorporated by reference in its entirety.

STATEMENT OF GOVERNMENT SUPPORT

This invention was made with Government support under Contract No. DE-AC52-07NA27344 awarded by the United States Department of Energy. The Government has certain rights in the invention.

FIELD

The present disclosure generally relates to electrical devices based on nanostructures, such as carbon nanotubes, and methods of making and using the same, and more specifically, to electrically gated nanostructure devices and methods of making and using the same.

SUMMARY

In one aspect, which is combinable with any other aspect or embodiment, the present disclosure relates to a gated nanostructure device comprising, or consisting essentially of, or yet consisting of: a first substrate having a dielectric surface; a source electrode and a drain electrode, wherein at least one of the source electrode and the drain electrode is on the dielectric surface of the first substrate; a thick film comprising a conducting nanoporous material between the source electrode and the drain electrode; and a gate electrode above the dielectric surface of the first substrate, wherein the gate electrode modulates an electric current through the conducting nanoporous material between the source electrode and the drain electrode throughout a thickness of the thick film; wherein the conducting nanoporous material comprises an exposed portion, which is exposed to an external environment, and pores of the conducting nanoporous material are at least partially aligned along a direction that is parallel or substantially parallel to a direction between the source electrode and the drain electrode.

In some embodiments, the conducting nanoporous material comprises, consists essentially of, or consists of a plurality of nanotubes. In some embodiments, the conducting nanotubes comprise, consist essentially of, or consist of carbon nanotubes ("CNTs"). In some embodiments, the thickness of the thick film is at least about 100 nm.

In some embodiments, the source electrode and the drain electrode are on the dielectric surface of the first substrate. In some embodiments, the thick film is on the dielectric surface of the first substrate, and the pores of the nanoporous material are aligned parallel or substantially parallel to the dielectric surface of the first substrate. In some embodiments, the gate electrode is a strip covering a portion of the conducting nanoporous material.

In some embodiments, a gated nanostructure device further comprises, consists essentially of, or yet further consists of an additional electrode between the source electrode and the drain electrode, and the conducting nanoporous material comprises, or consists essentially of, or yet further consists of: (i) a first section between the source electrode and the additional electrode; and (ii) a second section between the additional electrode and the drain electrode; wherein the gate electrode is on one of the first section and the second section and the other of the first section and the second section includes the exposed portion.

In some embodiments, the gate electrode is inside of the pores of the conducting nanoporous material. In some embodiments, the gate electrode comprises, consists essentially of, or consists of a plurality of electric field enhancing elements on the dielectric surface and a plurality of recessed elements on the dielectric surface, wherein two adjacent electric field concentrating elements of said plurality of electric field enhancing elements are separated by a recessed element of said plurality of recessed elements and wherein the electric field enhancing elements of said plurality of electric field enhancing elements and the recessed elements of said plurality of recessed elements extend between the source electrode and the drain electrode. In some embodiments, a dimension of an individual electric field enhancing element of said plurality of electric field enhancing elements in a direction parallel or substantially parallel to the dielectric surface and perpendicular or substantially perpendicular to a direction between the source electrode and the drain electrode, is from about 0.01 µm to about 10 µm. In some embodiments, a dimension of an individual electric field enhancing element of said plurality of electric field enhancing elements, which is perpendicular or substantially perpendicular to the dielectric surface is from about 0.01 µm to about 100 µm.

In some embodiments, an individual electric field enhancing element of said plurality of electric field concentrating elements is an array comprising, consisting essentially of, or consisting of a plurality of elevated sub-elements and a plurality of recessed sub-elements, such that two adjacent elevated sub-elements of the plurality of elevated sub-elements are separated by a recessed sub-element of said plurality of recessed sub-elements in the direction between the source electrode and the drain electrode.

In some embodiments, the gate electrode extends over the dielectric surface of the first substrate and the thick film is a curved film that curves over the gate electrode between the source electrode and the drain electrode.

In some embodiments, a gated nanostructure device according to the present disclosure further comprises, consists essentially of, or yet further consists of a second substrate comprising, consisting essentially of, or consisting of a first surface having a dielectric portion, wherein the drain electrode is on the dielectric portion of the first surface of the second substrate, the source electrode is on the dielectric surface of the first substrate, the pores of the nanoporous material are aligned perpendicular or substantially perpendicular to the dielectric surface of the first substrate, and the gate electrode extends from the first surface of the second substrate through at least a portion of the thickness of the thick film. In some embodiments, the gate electrode extends through the thickness of the thick film from the second substrate to the first substrate In some embodiments, the first surface of the second substrate faces the dielectric surface of the first substrate. In some embodiments, the dielectric surface of the first substrate faces a second surface of the second substrate, which is opposite to the first surface of the second substrate.

In some embodiments, the thick film has a circular shape with a diameter from about 0.01 µm to about 1,000 µm in a cross section parallel or substantially parallel to the dielectric surface of the first substrate. In some embodiments, the gate electrode further comprises, consists essentially of, or yet further consists of a plurality of gate elements, each extending from the first surface of the second substrate through at least a portion of the thickness of the thick film.

In another aspect, which may be combined with any other aspect or embodiment, the present disclosure relates to a gated nanostructure device according to any of the above embodiments, which is a sensing device configured to detect a chemical species in an external environment upon a exposure of the exposed portion of the conducting nanoporous material to the chemical species.

In another aspect, which may be combined with any other aspect or embodiment, the present disclosure relates to a method of detecting a chemical species in an external environment comprising, consisting essentially of, or consisting of: exposing the exposed portion of the conducting nanoporous material of the gated nanostructure device to the chemical species to generate an electrical response in the conducting nanoporous material; and modulating the electric current through the conducting nanoporous material between the source electrode and the drain electrode by applying a gating voltage to the gate electrode to amplify said electrical response.

FIGURES

Various aspects of the disclosure are set forth with particularity in the appended claims. A better understanding of the features and advantages of the present disclosure will be obtained by reference to the following detailed description that sets forth illustrative embodiments, in which the principles of the disclosure are utilized, and the accompanying drawings, which are as follows:

FIG. 1 schematically illustrates a conventional channel gate 2D configuration.

Figure 2:
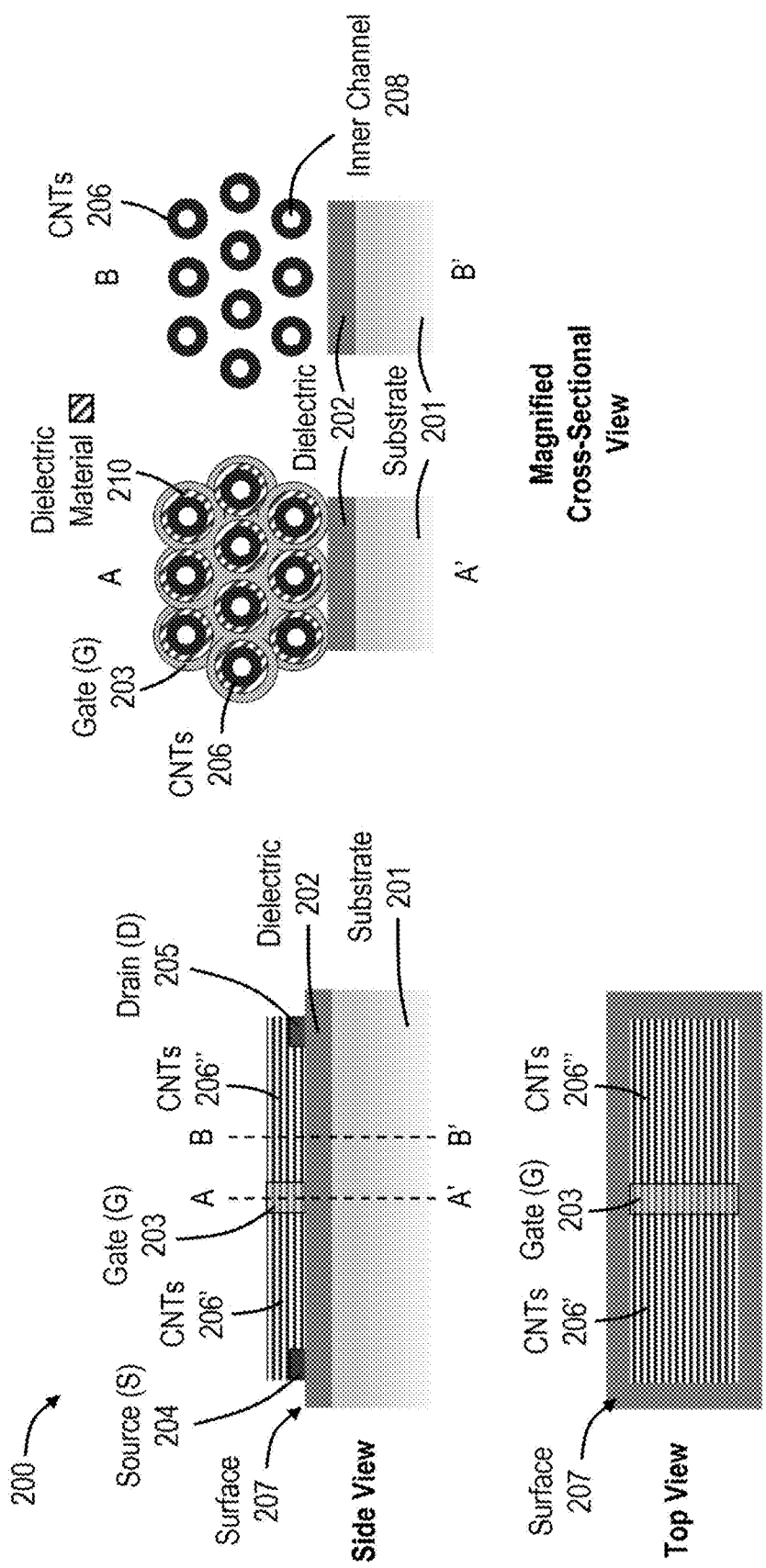

FIG. 2 schematically illustrates an embodiment of a gated nanostructured device with a gate-all-around strip configuration.

Figure 3:
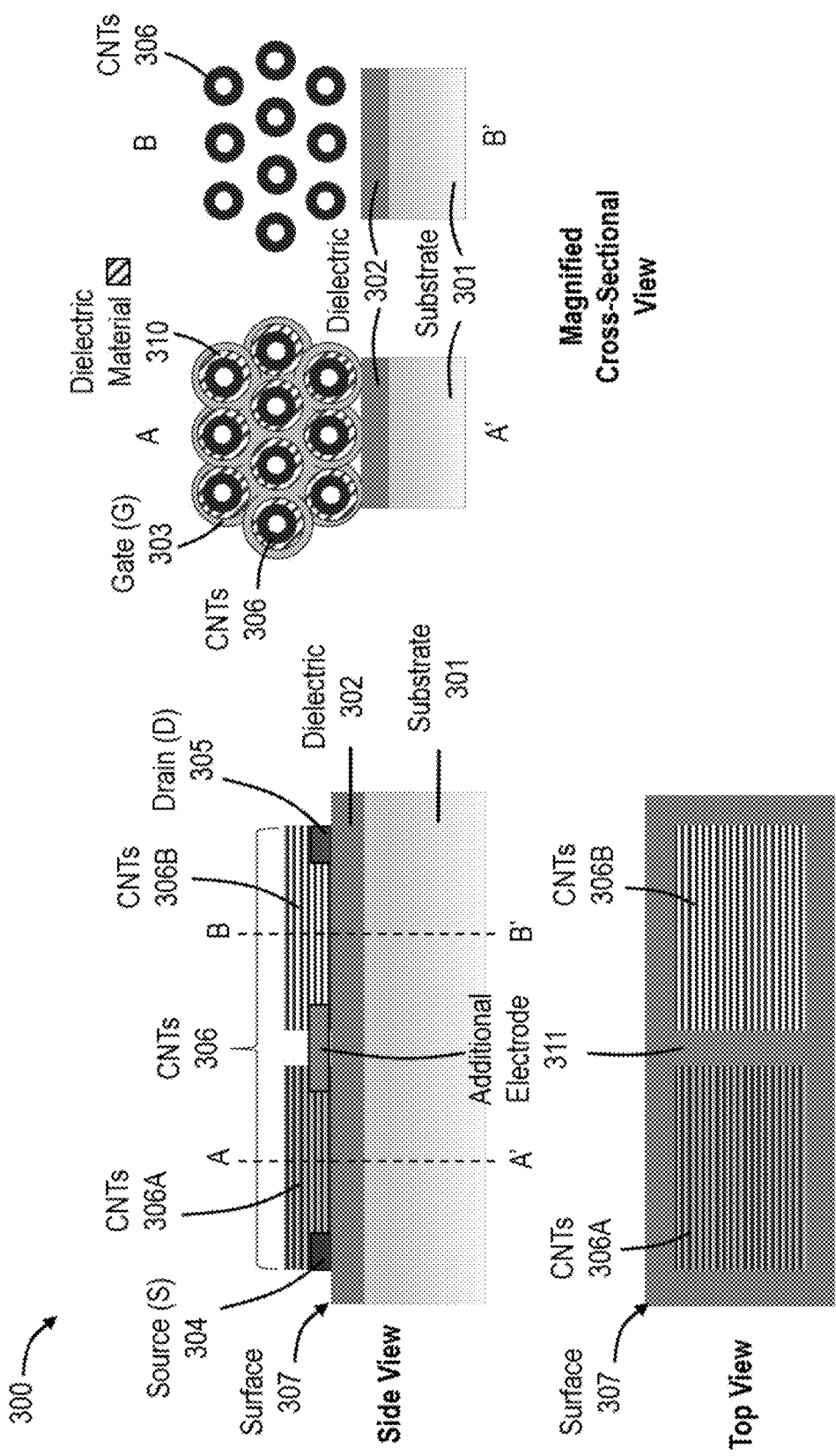

FIG. 3 schematically illustrates an embodiment of a gated nanostructured device with a gate-all-around in series configuration.

Figure 4:
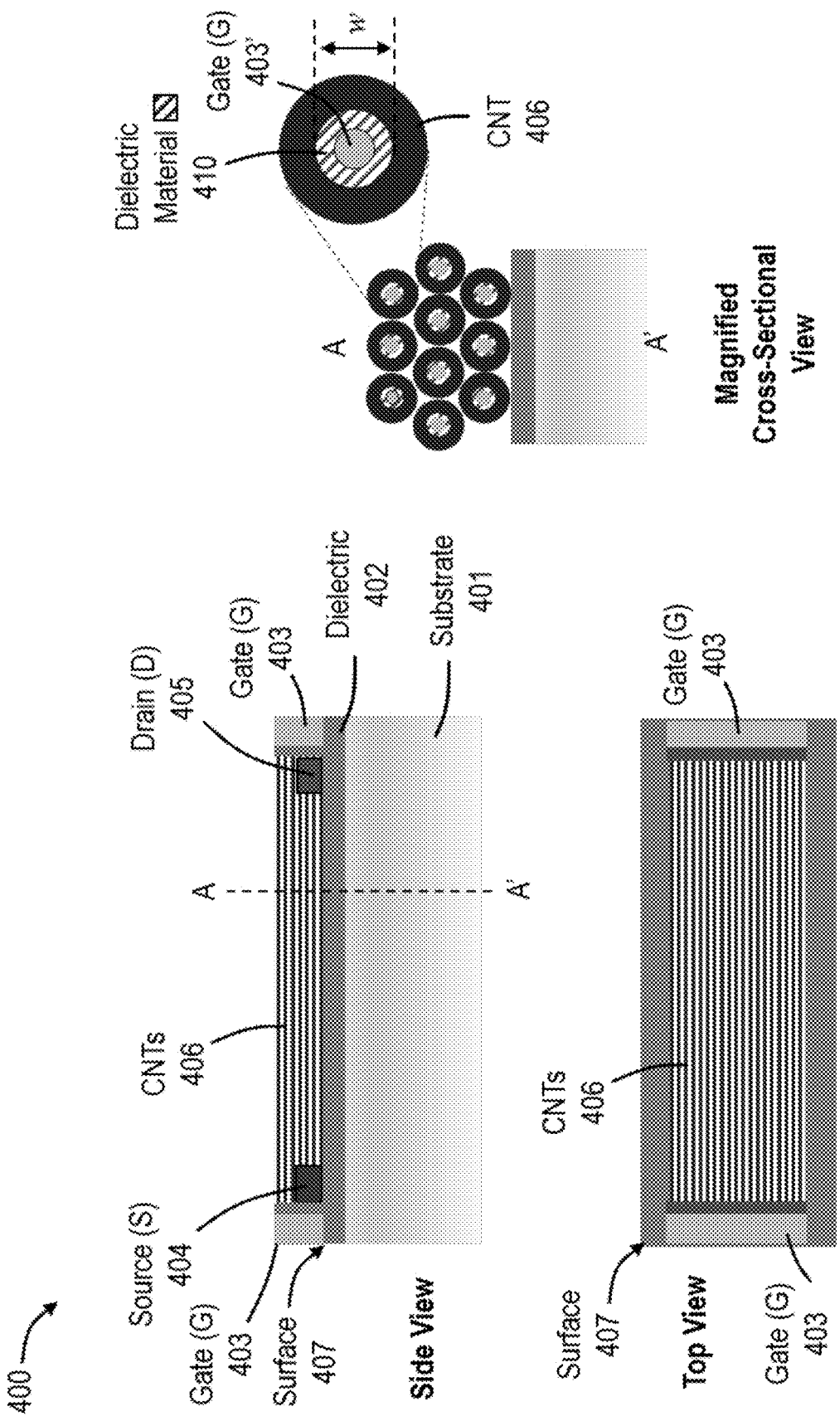

FIG. 4 schematically illustrates an embodiment of a gated nanostructured device with a core gate 2D configuration.

Figure 5:
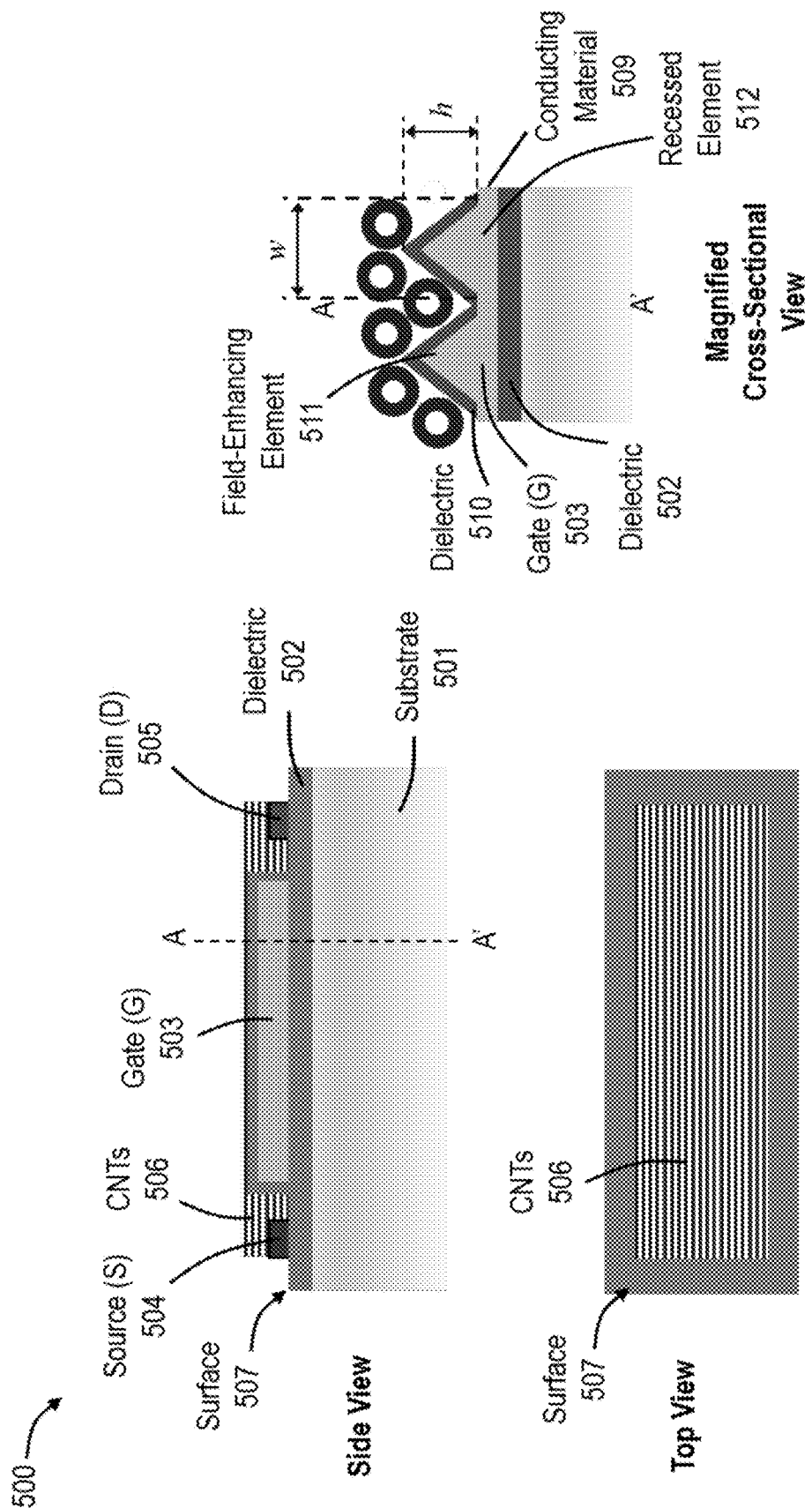

FIG. 5 schematically illustrates an embodiment of a gated nanostructured device with a trench gate 2D configuration.

Figure 6:
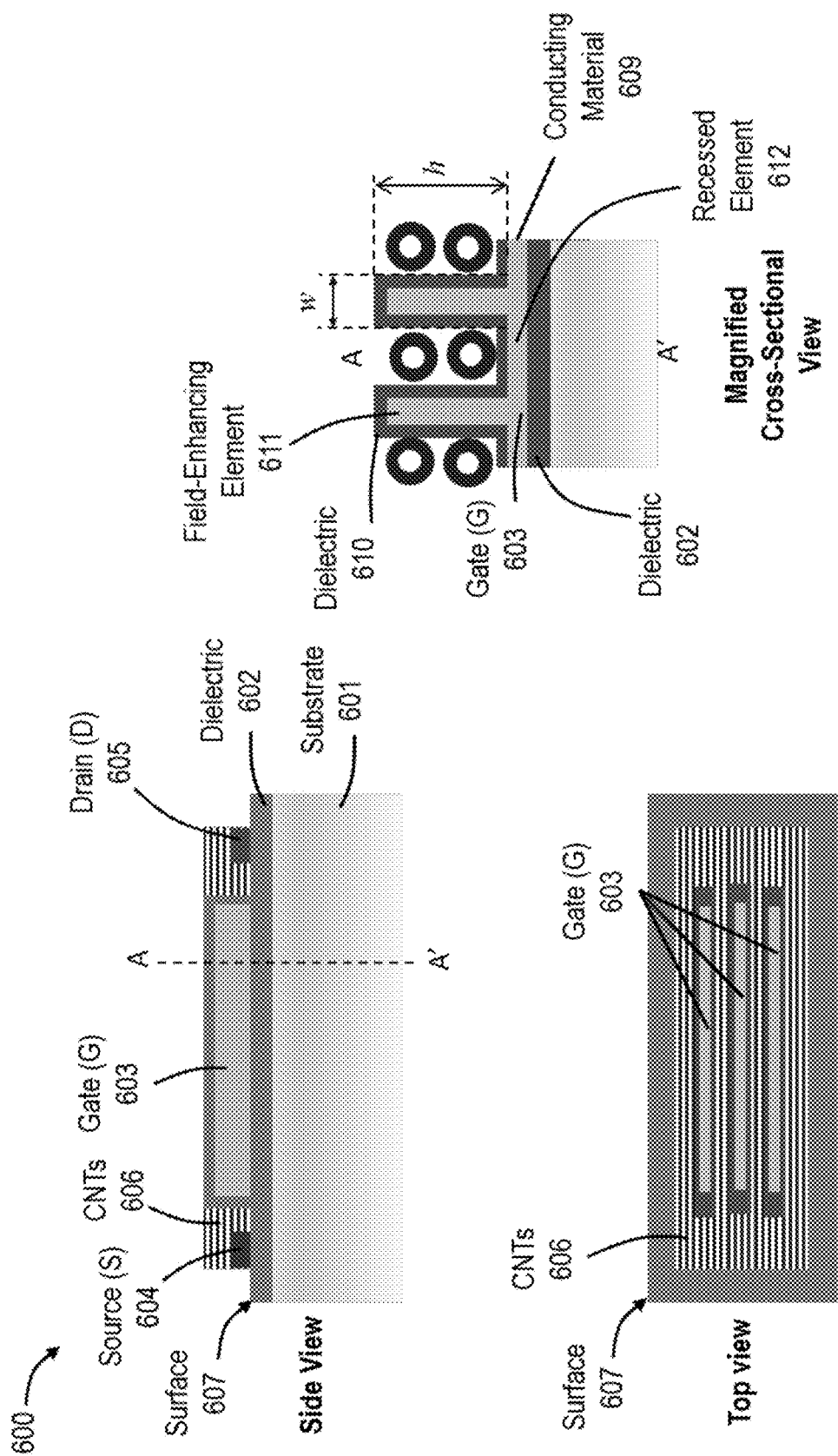

FIG. 6 schematically illustrates an embodiment of a gated nanostructured device with a ridge gate 2D configuration.

Figure 7:
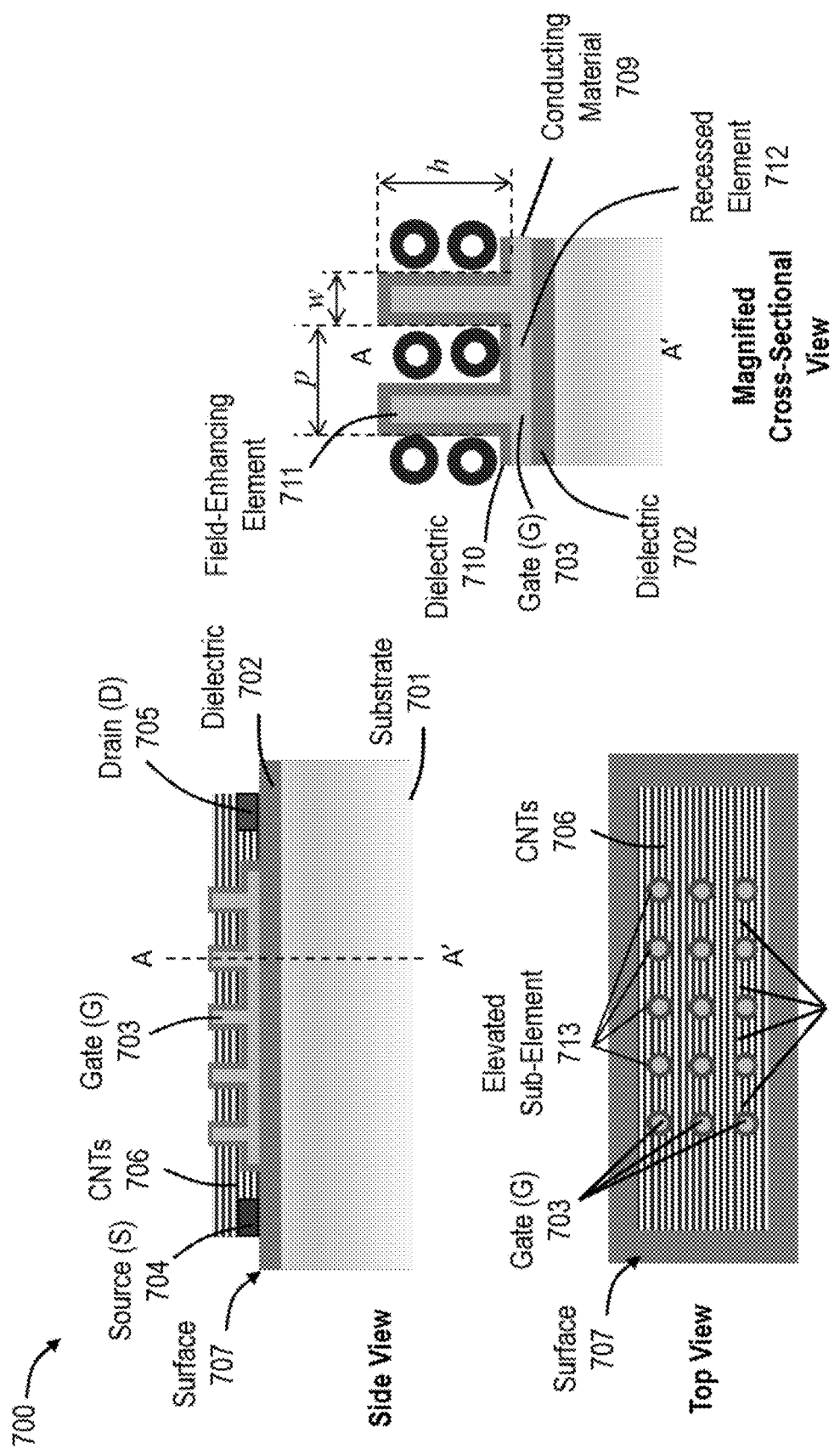

FIG. 7 schematically illustrates an embodiment of a gated nanostructured device with a spike gate 2D configuration.

Figure 8:
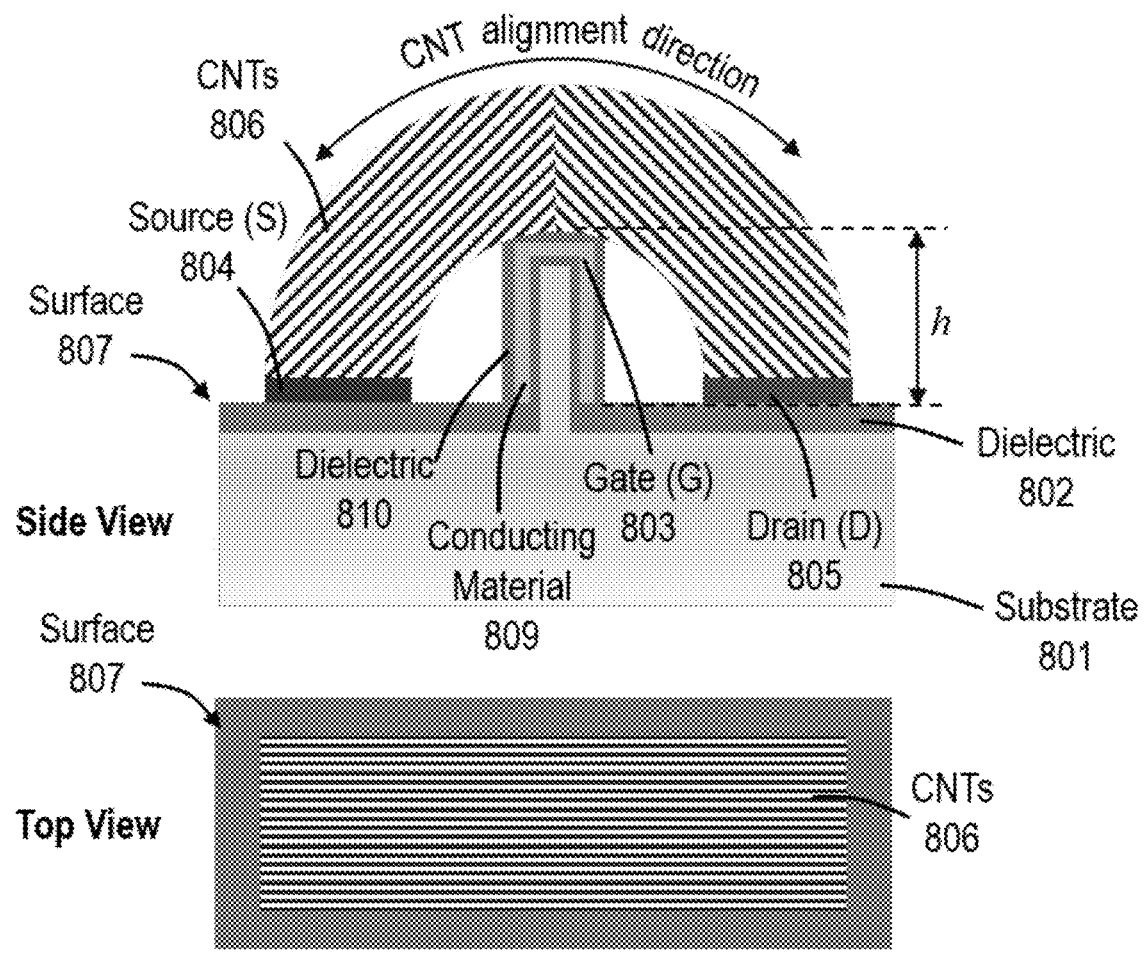

FIG. 8 schematically illustrates an embodiment of a gated nanostructured device with a 3D out-of-plane self-directed curved channel.

Figure 9:
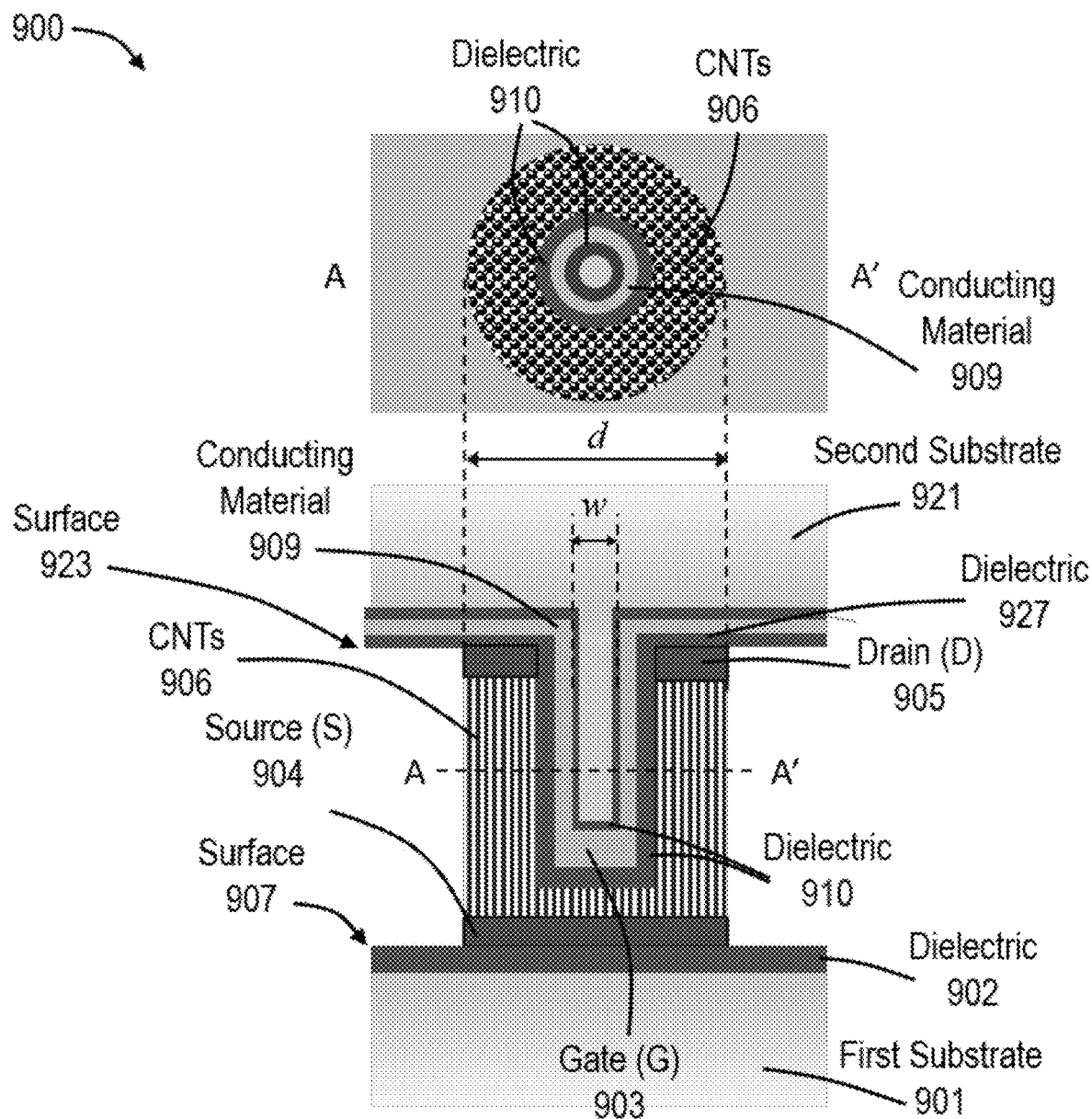

FIG. 9 schematically illustrates an embodiment of a gated nanostructured device with a 3D out-of-plane configuration with a single large pillar.

Figure 10:
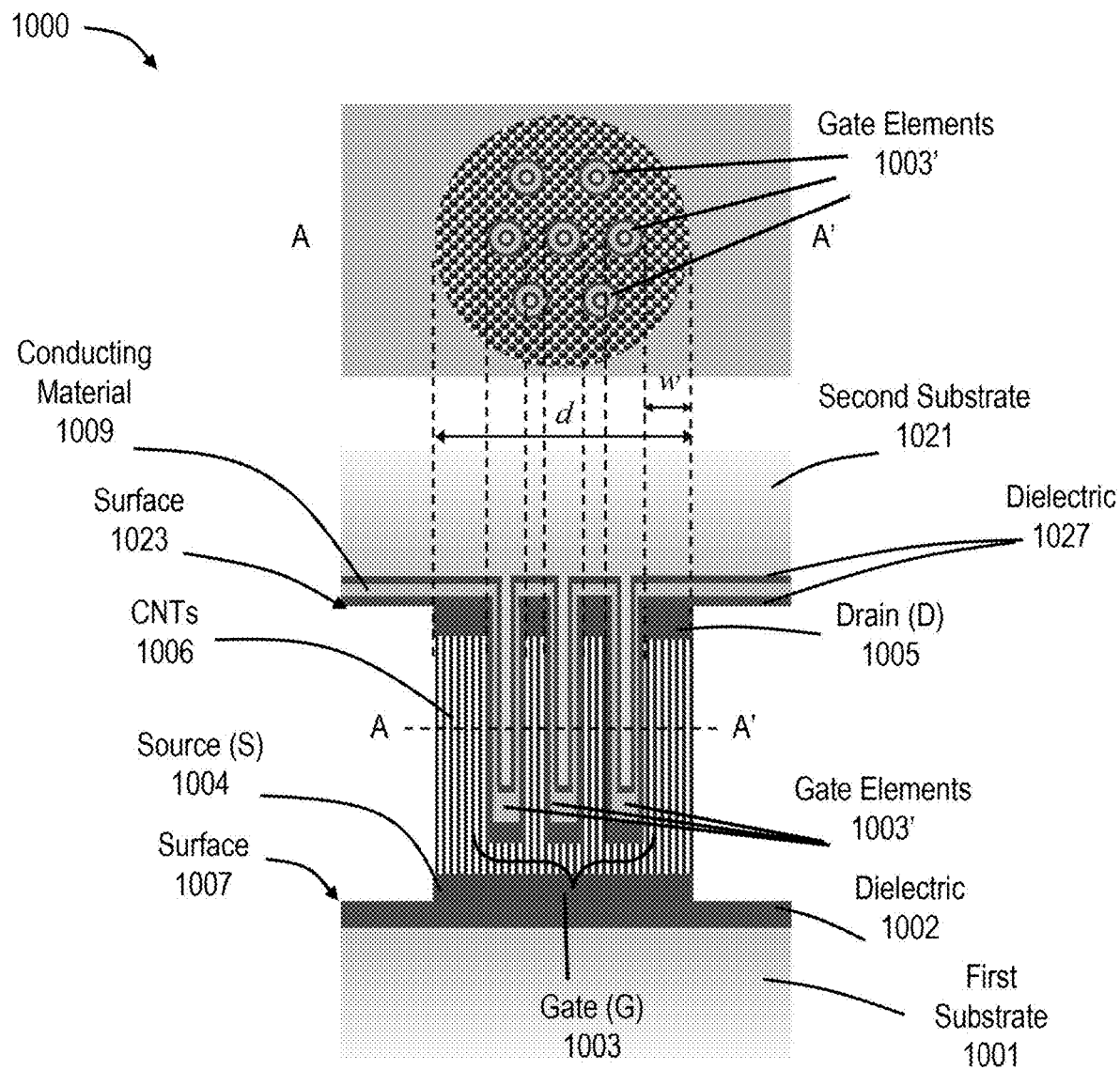

FIG. 10 schematically illustrates an embodiment of a gated nanostructured device with a 3D out-of-plane configuration with an array of small pillars.

Figure 11:
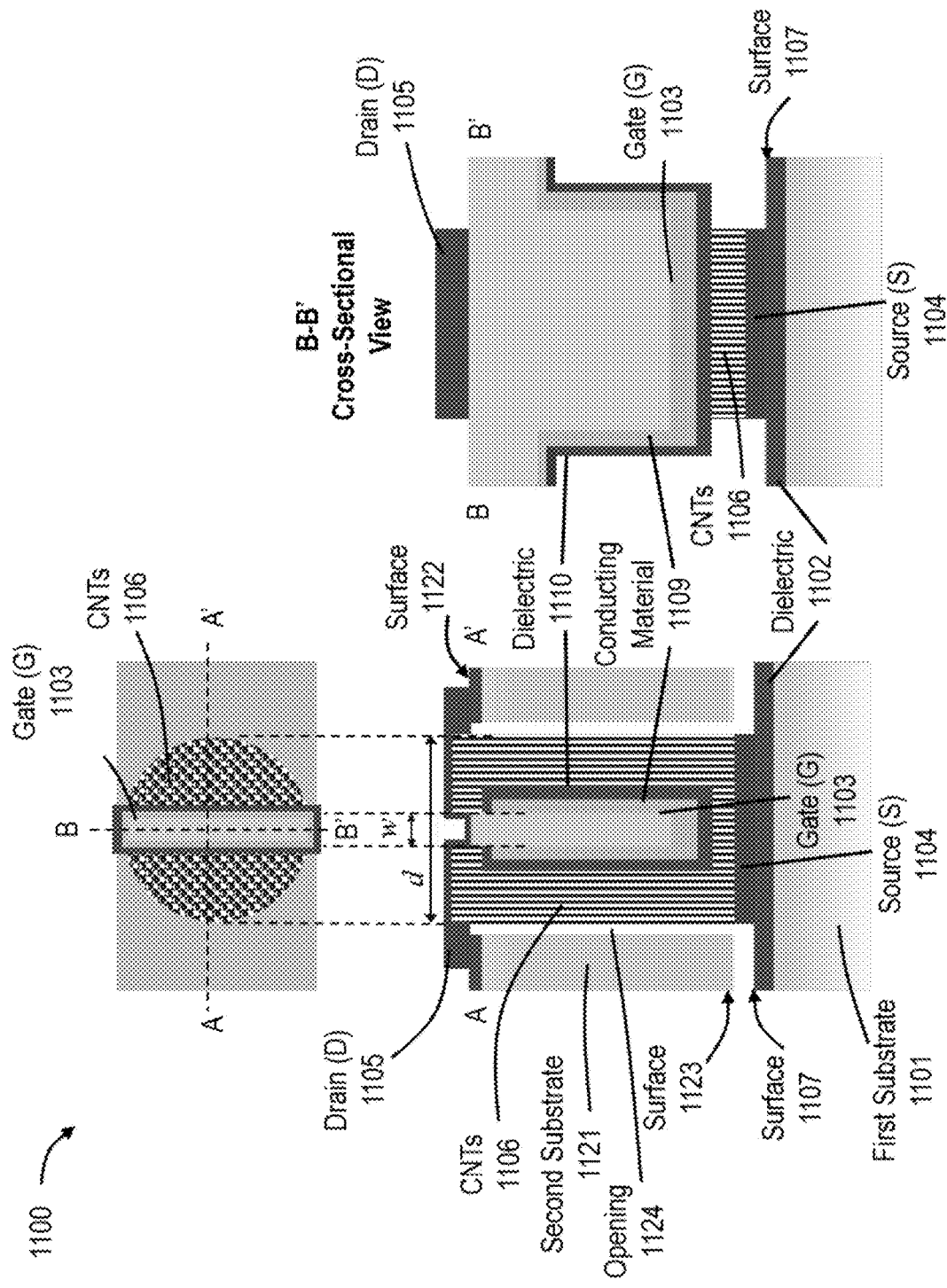

FIG. 11 schematically illustrates an embodiment of a gated nanostructured device with a 3D out of-plane configuration with through-substrate via (TSV) holes.

DETAILED DESCRIPTION

Definitions

All publications, patents, and patent applications mentioned in this specification and attached Appendices are herein incorporated by reference to the same extent as if each individual publication, patent, or patent application was specifically and individually indicated to be incorporated by reference.

Unless otherwise specified, "a" or "an" means one or more. In this application, the use of "or" means "and/or" unless stated otherwise. Furthermore, use of the term "including" as well as other forms, such as "include", "includes," and "included," is not limiting.

As used herein, the term "comprising" is intended to mean that the methods include the recited steps or elements, but do not exclude others. "Consisting essentially of" shall mean rendering the claims open only for the inclusion of steps or elements, which do not materially affect the basic and novel characteristics of the claimed methods. "Consisting of" shall mean excluding any element or step not specified in the claim. Embodiments defined by each of these transition terms are within the scope of this disclosure.

The term "substantially perpendicular" as applied to pores of a nanoporous material, and/or nanotubes, such as carbon nanotubes, and their inner channels, means that an alignment axis deviates from a normal of a surface, such as a surface of a substrate, by no more than about 10°, no more than about 5°, no more than about 3°, or no more than about 2°. In many embodiments, nanotubes, such as carbon nanotubes, which are substantially perpendicular to a surface of a substrate, may be perpendicular to the face of the substrate.

The term "substantially parallel" as applied to pores of a nanoporous material, and/or nanotubes, such as carbon nanotubes, and their inner channels means that an alignment axis deviates from being parallel to a surface, such as a surface of a substrate, by no more than about 10°, no more than about 5°, no more than about 3°, or no more than about 2°. In many embodiments, nanotubes, such as carbon nanotubes, which are substantially parallel to a face of a substrate, may be parallel to the face of the substrate.

As used herein, the term "partially aligned" as applied to pores of a nanoporous material, and/or nanotubes, such as carbon nanotubes, and their inner channels means that at least 20%, at least 25%, at least 30%, at least 35%, at least 40%, at least 45%, at least 50%, at least 55%, at least 60%, at least 65%, at least 70%, at least 75%, at least 80%, at least 85%, at least 90%, at least 95%, at least 99%, or greater, of the pores of the nanoporous material are aligned substantially parallel or parallel in or along a direction, e.g., a direction between the source electrode and the drain electrode. In some embodiments, pores of a nanoporous material, such as carbon nanotubes, which are at least partially aligned along a direction that is substantially parallel or parallel to a direction between the source electrode and the drain electrode, may be completely (100%) aligned.

As used herein, the term "about" means ±20%, or ±10%, or ±5%, or ±2%, or ±1% of a numeric value to which the term is applied.

As used herein, the term "external environment" means a liquid and/or gaseous environment external to the surface of a conductive nanoporous material in a gated nanostructure device. For example, the external environment may be a liquid medium containing one or more chemical species of interest that may bind to the outer surfaces of the conductive nanoporous material. Alternatively, the external environment may be, e.g., ambient air or any other gaseous environment (e.g., an exhaust) containing one or more chemical species or particulates of interest that can bind to the outer surfaces of the conductive nanoporous material.

This disclosure uses the terms "horizontal," "upward", "downward", "vertical" and their derivatives only for the purpose of illustrating relationships between orientations of various elements of the device. However, these terms cannot be used for limiting an absolute orientation of the device. For example, the terms "horizontally aligned" and "vertically aligned" as applied to carbon nanotubes are respectively used only to illustrate that the carbon nanotubes are aligned substantially parallel and substantially perpendicular to a face of a substrate. The terms "downward" and "upward" as applied to a first face and a second face of the substrate are used only to illustrate that the first face is opposite to the second face.

INTRODUCTION

Molecular sensors, such as gas or liquid sensors, are important across many industries, including the automotive, aerospace, energy (e.g., fossil fuels), and biomedical industries. For example, in biomedical applications, molecular sensors may be used in wearable biomedical devices.

Two important performance factors for a sensor are its sensitivity (e.g., its detection limit) and its selectivity (e.g., specificity). 1D and 2D materials, such as carbon nanotubes or graphene (and other 1D and 2D materials), possess properties making them attractive for use in sensing elements. For example, carbon nanotubes have a combination of favorable properties, including high electrical conductivity, thermal stability, 1-dimensional form factor, high specific surface area, and a carbon lattice that may be easy to chemically functionalize.

The sensing transduction mechanism for nanostructures (e.g., carbon nanotubes) with atomically thin features may be related to a change in the local electric field in the nanostructure when a target molecular species comes in close proximity to the surface of the nanostructure. The electrical response depends on certain geometric and electronic (e.g., charge) properties of a target molecule, which may enable specificity of detection. This specificity can be enhanced or tuned by altering the surface of the nanostructure by doping with other materials, adding or removing some material, or covalently attaching or adsorbing chemical species. In this scheme, it is important both for the chemical altering step and ultimately the sensing function that the surface of the nanostructure remain exposed to the surrounding environment.

To maximize sensitivity, it is common to apply a gating voltage to a sensing device to modulate the channel current and maximize the signal gain registered from a detection event. Another advantageous feature for high sensitivity and fast response time is a large surface area per areal footprint of the sensor. Thus, it may be advantageous to have many nanostructures (e.g., carbon nanotubes) packed together within a small area of, for example, a 2D planar film or a 3D out-of-plane architecture. However, gating a thick film (e.g., at least 100 nm thick) comprising high-surface-area nanostructures or out-of-plane architectures may not be possible with typical top-gate and bottom-gate configurations. This is because the electric field may not extend sufficiently or uniformly through the entire ensemble of nanostructures, so the current through a thick film of conducting nanostructures will not be modulated as desired simply by adjusting the gate voltage.

Previous approaches for gating nanostructured films include contact and non-contact approaches. However, known non-contact techniques (e.g., involving light probes) are inapplicable to thick films of nanostructures due to limits of optical penetration depth. Meanwhile, a known contact method for gating nanostructured films involves applying a liquid or gel partially comprising ions to a nanostructured film. Applying a voltage bias to the ionic medium causes an electric double layer to form locally around the surfaces of individual nanostructures, enabling modulation of the current in the nanostructures. Another known contact method involves using a gate-all-around configuration, the gate being a solid-state material that is deposited conformally (e.g., by atomic layer deposition) to cover the surfaces of individual nanostructures. This produces a local field effect on the nanostructure, which modulates the current in the nanostructures in a manner similar to applying a liquid or gel comprising ions. However, these known contact methods are ineffective for applications in which the surface of the nanostructure must remain exposed for functionalization and sensing by direct contact with a medium.

Therefore, there exists great interest in gated nanostructure devices which enable effective modulation of electrical performance of thick (e.g., at least 100 nm) nanostructured films, which leave at least a portion of the nanostructured thick film exposed to the surrounding environment or medium for functionalization and sensing by direct contact with the medium.

DISCLOSURE

The present inventors developed a number of approaches to enable gating of thick nanostructure architectures, such as a 2D planar architecture or a 3D out-of-plane architecture, comprising nanostructures (e.g., carbon nanotubes ("CNTs")) while maintaining a substantial surface area available for sensing.

FIG. 1 illustrates a conventional gated nanostructure device 100, having a substrate 101 with a dielectric layer 102, which encloses a plain gate electrode 103. Source electrode 104 and drain electrode 105 are disposed on a surface 107 of the dielectric layer 102. A conducting nanoporous film 106, such as a film comprising nanotubes (e.g., CNTs) is between the source electrode 104 and the drain electrode 105 on the surface 107 of the dielectric layer 102. Such a configuration may not be applicable for modulating an electric current through the conducting nanoporous film 106 between the source electrode 104 and the drain electrode 105 by applying a gating voltage to the gate electrode 103 when the conducting nanoporous film 106 is thick (e.g., at least about 100 nm) because an electric field produced by the gate electrode 103 will not penetrate the entire thickness of the film 106.

The present inventors developed gated nanostructure devices in which an electric field from a gate electrode can penetrate through the entire thickness of a thick conducting nanoporous film, such as a thick film comprising nanotubes (e.g., CNTs), while leaving a substantial portion of the film exposed to an external environment for sensing and/or chemical functionalization.

In some embodiments, the conducting nanoporous films comprise, consist essentially of, or consist of nanotubes. In some embodiments, the nanotubes may comprise any suitable material or combination of materials. For example, in some embodiments, the nanotubes may comprise consist essentially of, or consist of carbon, doped carbon, van der Waals materials or layered materials (e.g., h-BN, BP, binary transition metal chalcogenides ("TMCs"), including: $MoS_2$, $MoSe_2$, $MoTe_2$, $WS_2$, $WSe_2$, $WTe_2$, $ReS_2$, $ReSe_2$, $PdS_2$, $PdSe_2$, $PtS_2$, $PtSe_2$, $PtTe_2$, $FeSe$, $TiS_2$, $TiSe_2$, $TiTe_2$, $ZrS_2$, $ZrSe_2$, $ZrTe_2$, $HfS_2$, $HfSe_2$, $HfTe_2$, $VS_2$, $VSe_2$, $VTe_2$, $NbS_2$, $NbSe_2$, $NbTe_2$, $TaS_2$, $TaSe_2$, $TaTe_2$; TMC alloys, including: $Mo_xNb_{1-x}S_2$, $MoS_{2x}Te_{2(1-x)}$, $W_xNb_{1-x}S_2$, $Mo_xNb_{1-x}Se_2$, $MoSe_{2x}Te_{2(1-x)}$, $NbS_{2x}Se_{2(1-x)}$, $Mo_xW_{1-x}Te_2$, $WS_{2x}Te_{2(1-x)}$, $Mo_{1-x}Re_xS_2$, etc.; and TMC heterostructures, including 2H—$MoTe_2$-1T-$MoTe_2$, $MoS_2$—$NbSe_2$, etc.) or other synthetic or naturally-occurring materials. Non-exhaustive lists of such materials, which may be suitable as components (e.g., nanotubes) in nanoporous conductive films according to the present disclosure are described in, e.g., Mounet, et al., *Nature Nanotechnol.* 13, 246-252 (2018) and Zhou, et al., *Nature,* 556, 355-359 (2018), which are hereby incorporated by reference in their entireties. In some embodiments, the nanotubes may comprise, consist essentially of, or consist of single materials (e.g., CNTs).

In some embodiments, the nanotubes may comprise, consist essentially of, or consist of heterostructures comprising multiple different materials, including but not limited to: coaxial CNT-BNNT-$MoS_2$ heterojunctions, as described in Xiang, et al., *Science,* 367, 537-542 (2020); SnSe-CNT core-shell heterostructures, as described in Slade, et al., *Nano Lett.,* 19, 2979-2984 (2019); and/or MoTe-CNT core-shell heterostructures, as described in Nagata, et al., *Nano Lett.,* 19, 4845-4851 (2019). These references are hereby incorporated by reference in their entireties. In some embodiments, the nanotubes may comprise, consist essentially of, or consist of carbon nanotubes ("CNTs").

In some embodiments, the nanotubes may comprise, consist essentially of, or consist of single-wall nanotubes and/or multi-wall nanotubes (e.g., double-wall nanotubes). In some embodiments, the nanotubes may comprise, consist essentially of, or consist of single-wall carbon nanotubes ("SWCNTs") and/or multi-wall carbon nanotubes ("MWCNTs"), e.g., double-wall carbon nanotubes ("DWCNTs"). In some embodiments, the nanotubes comprise, consist essentially of, or consist of SWCNTs.

In some embodiments, the nanotubes (e.g., CNTs) may have an average internal diameter (e.g., measured carbon-carbon for CNTs) of from about 0.4 nm to about 100 nm, about 0.5 nm to about 100 nm, about 0.6 nm to about 100 nm, about 0.7 nm to about 100 nm, about 0.8 nm to about 100 nm, about 0.9 nm to about 100 nm, about 1.0 nm to about 100 nm, about 1.5 nm to about 100 nm, about 2.0 nm to about 100 nm, about 2.5 nm to about 100 nm, about 3.0 nm to about 100 nm, about 3.5 nm to about 100 nm, about 4.0 nm to about 100 nm, about 4.5 nm to about 100 nm, about 5.0 nm to about 100 nm, about 5.5 nm to about 100 nm, about 6.0 nm to about 100 nm, about 6.5 nm to about 100 nm, about 7.0 nm to about 100 nm, about 7.5 nm to about 100 nm, about 8.0 nm to about 100 nm, about 8.5 nm to about 100 nm, about 9.0 nm to about 100 nm, about 9.5 nm to about 100 nm, about 10 nm to about 100 nm, about 15 nm to about 100 nm, about 20 nm to about 100 nm, about 25 nm to about 100 nm, about 30 nm to about 100 nm, about 35 nm to about 100 nm, about 40 nm to about 100 nm, about 45 nm to about 100 nm, about 50 nm to about 100 nm, about 55 nm to about 100 nm, about 60 nm to about 100 nm, about 65 nm to about 100 nm, about 70 nm to about 100 nm, about 75 nm to about 100 nm, about 80 nm to about 100 nm, about 85 nm to about 100 nm, about 90 nm to about 100 nm, about 95 nm to about 100 nm, or any range or value therein between.

In some embodiments, the nanotubes (e.g., CNTs) may have an average internal diameter (e.g., measured carbon-carbon for CNTs) of from about 0.4 nm to about 100 nm, about 0.5 nm to about 95 nm, about 0.6 nm to about 90 nm, about 0.7 nm to about 85 nm, about 0.8 nm to about 80 nm, about 0.9 nm to about 75 nm, about 1.0 nm to about 70 nm, about 1.2 nm to about 65 nm, about 1.4 nm to about 60 nm, about 1.6 nm to about 55 nm, about 1.8 nm to about 50 nm, about 2.0 nm to about 45 nm, about 2.5 nm to about 40 nm, about 3.0 nm to about 35 nm, about 3.5 nm to about 30 nm, about 4.0 nm to about 25 nm, about 4.5 nm to about 20 nm, about 5.0 nm to about 15 nm, about 5.5 nm to about 10 nm, or any subrange or value therein.

In some embodiments the nanotubes (e.g., CNTs) may have an average internal diameter (e.g., measured carbon-carbon for CNTs) of about 0.4 nm, about 0.45 nm, about 0.5 nm, about 0.55 nm, about 0.6 nm, about 0.65 nm, about 0.7 nm, about 0.75 nm, about 0.8 nm, about 0.85 nm, about 0.9 nm, about 0.95 nm, about 1 nm, about 1.05 nm, about 1.1 nm, about 1.15 nm, about 1.2 nm, about 1.25 nm, about 1.3 nm, about 1.35 nm, about 1.4 nm, about 1.45 nm, about 1.50 nm, about 1.55 nm, about 1.60 nm, about 1.65 nm, about 1.70 nm, about 1.75 nm, about 1.80 nm, about 1.85 nm, about 1.90 nm, about 1.95 nm, about 2.00 nm, about 2.05 nm, about 2.10 nm, about 2.15 nm, about 2.20 nm, about 2.25 nm, about 2.30 nm, about 2.35 nm, about 2.40 nm, about 2.45 nm, about 2.50 nm, about 2.55 nm, about 2.60 nm, about 2.65 nm, about 2.70 nm, about 2.75 nm, about 2.80 nm, about 2.85 nm, about 2.90 nm, about 2.95 nm, about 3.00 nm, about 3.05 nm, about 3.10 nm, about 3.15 nm, about 3.20 nm, about 3.25 nm, about 3.30 nm, about 3.35 nm, about 3.40 nm, about 3.45 nm, about 3.50 nm, about 3.55 nm, about 3.60 nm, about 3.65 nm, about 3.70 nm, about 3.75 nm, about 3.80 nm, about 3.85 nm, about 3.90 nm, about 3.95 nm, about 4.00 nm, about 4.1 nm, about 4.2 nm, about 4.3 nm, about 4.4 nm, about 4.5 nm, about 4.6 nm, about 4.7 nm, about 4.8 nm, about 4.9 nm, about 5.0 nm, about 5.5 nm, about 6.0 nm, about 6.5 nm, about 7.0 nm, about 7.5 nm, about 8.0 nm, about 8.5 nm, about 9.0 nm, about 9.5 nm, about 10 nm, about 15 nm, about 20 nm, about 25 nm, about 30 nm, about 35 nm, about 40 nm, about 45 nm, about 50 nm, about 55 nm, about 60 nm, about 65 nm, about 70 nm, about 75 nm, about 80 nm, about 85 nm, about 90 nm, about 95 nm, about 100 nm, or greater, or any range or value therein between.

In some embodiments, the nanotubes (e.g., CNTs) may have an average outer diameter of from about 0.5 nm to about 110 nm, about 0.6 nm to about 110 nm, about 0.7 nm to about 110 nm, about 0.8 nm to about 110 nm, about 0.9 nm to about 110 nm, about 1.0 nm to about 110 nm, about 1.5 nm to about 110 nm, about 2.0 nm to about 110 nm, about 2.5 nm to about 110 nm, about 3.0 nm to about 110 nm, about 3.5 nm to about 110 nm, about 4.0 nm to about 110 nm, about 4.5 nm to about 110 nm, about 5.0 nm to about 110 nm, about 5.5 nm to about 110 nm, about 6.0 nm to about 110 nm, about 6.5 nm to about 110 nm, about 7.0 nm to about 110 nm, about 7.5 nm to about 110 nm, about 8.0 nm to about 110 nm, about 8.5 nm to about 110 nm, about 9.0 nm to about 110 nm, about 9.5 nm to about 110 nm, about 10 nm to about 110 nm, about 15 nm to about 110 nm, about 20 nm to about 110 nm, about 25 nm to about 110 nm, about 30 nm to about 110 nm, about 35 nm to about 110 nm, about 40 nm to about 110 nm, about 45 nm to about 110 nm, about 50 nm to about 110 nm, about 55 nm to about 110 nm, about 60 nm to about 110 nm, about 65 nm to about 110 nm, about 70 nm to about 110 nm, about 75 nm to about 110 nm, about 80 nm to about 110 nm, about 85 nm to about 110 nm, about 90 nm to about 110 nm, about 95 nm to about 110 nm, about 100 nm to about 110 nm, about 105 nm to about 110 nm, or any range or value therein between.

In some embodiments the nanotubes (e.g., CNTs) may have an average outer diameter of about 0.5 nm, about 0.55 nm, about 0.6 nm, about 0.65 nm, about 0.7 nm, about 0.75 nm, about 0.8 nm, about 0.85 nm, about 0.9 nm, about 0.95 nm, about 1 nm, about 1.05 nm, about 1.1 nm, about 1.15 nm, about 1.2 nm, about 1.25 nm, about 1.3 nm, about 1.35 nm, about 1.4 nm, about 1.45 nm, about 1.50 nm, about 1.55 nm, about 1.60 nm, about 1.65 nm, about 1.70 nm, about 1.75 nm, about 1.80 nm, about 1.85 nm, about 1.90 nm, about 1.95 nm, about 2.00 nm, about 2.05 nm, about 2.10 nm, about 2.15 nm, about 2.20 nm, about 2.25 nm, about 2.30 nm, about 2.35 nm, about 2.40 nm, about 2.45 nm, about 2.50 nm, about 2.55 nm, about 2.60 nm, about 2.65 nm, about 2.70 nm, about 2.75 nm, about 2.80 nm, about 2.85 nm, about 2.90 nm, about 2.95 nm, about 3.00 nm, about 3.05 nm, about 3.10 nm, about 3.15 nm, about 3.20 nm, about 3.25 nm, about 3.30 nm, about 3.35 nm, about 3.40 nm, about 3.45 nm, about 3.50 nm, about 3.55 nm, about 3.60 nm, about 3.65 nm, about 3.70 nm, about 3.75 nm, about 3.80 nm, about 3.85 nm, about 3.90 nm, about 3.95 nm, about 4.00 nm, about 4.1 nm, about 4.2 nm, about 4.3 nm, about 4.4 nm, about 4.5 nm, about 4.6 nm, about 4.7 nm, about 4.8 nm, about 4.9 nm, about 5.0 nm, about 5.5 nm, about 6.0 nm, about 6.5 nm, about 7.0 nm, about 7.5 nm, about 8.0 nm, about 8.5 nm, about 9.0 nm, about 9.5 nm, about 10 nm, about 15 nm, about 20 nm, about 25 nm, about 30 nm, about 35 nm, about 40 nm, about 45 nm, about 50 nm, about 55 nm, about 60 nm, about 65 nm, about 70 nm, about 75 nm, about 80 nm, about 85 nm, about 90 nm, about 95 nm, about 100 nm, about 105 nm, about 110 nm, or greater, or any range or value therein between.

In some embodiments, the conducting nanoporous film may comprise nanotubes having an average length from about 10 nm to about 1 cm, from about 10 nm to about 5 mm, from about 10 nm to about 2 mm, from about 10 nm to about 1 mm, from about 10 nm to about 500 µm, from about 10 nm to about 200 µm, from about 10 nm to about 100 µm, from about 10 nm to about 50 µm, from about 10 nm to about 20 µm, from about 10 nm to about 10 µm, from about 10 nm to about 5 µm, from about 10 nm to about 2 µm, from about 10 nm to about 1 µm, from about 10 nm to about 500 nm, from about 10 nm to about 200 nm, from about 10 nm to about 100 nm, from about 10 nm to about 50 nm, from about 10 nm to about 20 nm, or any subrange or value therein. In some embodiments, the conducting nanoporous film may comprise nanotubes having an average length of from about 10 nm to about 1 cm, from about 20 nm to about 8 mm, from about 50 nm to about 5 mm, from about 80 nm to about 2 mm, from about 100 nm to about 1 mm, from about 200 nm to about 800 µm, from about 500 nm to about 500 µm, from about 800 nm to about 200 µm, from about 1 µm to about 100 µm, from about 2 µm to about 80 µm, from about 5 µm to about 50 µm, or from about 10 µm to about 20 µm, or any subrange or value therein.

In some embodiments, the conducting nanoporous film may comprise nanotubes having an average length of about 10 nm, about 20 nm, about 30 nm, about 40 nm, about 50 nm, about 60 nm, about 70 nm, about 80 nm, about 90 nm, about 100 nm, about 200 nm, about 300 nm, about 400 nm, about 500 nm, about 600 nm, about 700 nm, about 800 nm, about 900 nm, about 1 µm, about 2 µm, about 3 µm, about 4 µm, about 5 µm, about 6 µm, about 7 µm, about 8 µm, about 9 µm, about 10 µm, about 20 µm, about 30 µm, about 40 µm, about 50 µm, about 60 µm, about 70 µm, about 80 µm, about 90 µm, about 100 µm, about 200 µm, about 300 µm, about 400 µm, about 500 µm, about 600 µm, about 700 µm, about 800 µm, about 900 µm, about 1 mm, about 2 mm, about 3 mm, about 4 mm, about 5 mm, about 6 mm, about 7 mm, about 8 mm, about 9 mm, about 1 cm, about 2 cm, or any range or value therein between.

In some embodiments, the conducting nanoporous film may have a thickness of at least about 100 nm, at least about 150 nm, at least about 200 nm, at least about 250 nm, at least about 300 nm, at least about 350 nm, at least about 400 nm, at least about 450 nm, at least about 500 nm, at least about 550 nm, at least about 600 nm, at least about 650 nm, at least about 700 nm, at least about 750 nm, at least about 800 nm, at least about 850 nm, at least about 900 nm, at least about 950 nm, at least about 1 µm, at least about 2 µm, at least about 3 µm, at least about 4 µm, at least about 5 µm, at least about 6 µm, at least about 7 µm, at least about 8 µm, at least about 9 µm, at least about 10 µm, at least about 20 µm, at least about 30 µm, at least about 40 µm, at least about 50 µm, at least about 60 µm, at least about 70 µm, at least about 80 µm, at least about 90 µm, at least about 100 µm, at least about 200 µm, at least about 300 µm, at least about 400 µm, at least about 500 µm, at least about 600 µm, at least about 700 µm, at least about 800 µm, at least about 900 µm, at least about 1 mm, at least about 2 mm, at least about 3 mm, at least about 4 mm, at least about 5 mm, at least about 6 mm, at least about 7 mm, at least about 8 mm, at least about 9 mm, at least about 1 cm, or greater, or any range or value thereinbetween.

In some embodiments, the conducting nanoporous film may have a thickness from about 100 nm to about 1 cm, from about 100 nm to about 5 mm, from about 100 nm to about 3 mm, from about 100 nm to about 2 mm, from about 100 nm to about 1 mm, from about 100 nm to about 500 µm, from about 100 nm to about 300 µm, from about 100 nm to about 200 µm, from about 100 nm to about 100 µm, from about 100 nm to about 50 µm, from about 100 nm to about 30 µm, from about 100 nm to about 20 µm, from about 100 nm to about 10 µm, from about 100 nm to about 5 µm, from about 100 nm to about 3 µm, from about 100 nm to about 2 µm, from about 100 nm to about 1 µm, from about 100 nm to about 500 nm, or any subrange or value within these ranges.

in some embodiments, the conducting nanoporous film may have a thickness of about 100 nm, about 150 nm, about 200 nm, about 250 nm, about 300 nm, about 350 nm, about 400 nm, about 450 nm, about 500 nm, about 550 nm, about 600 nm, about 650 nm, about 700 nm, about 750 nm, about 800 nm, about 850 nm, about 900 nm, about 950 nm, about 1 µm, about 1.5 µm, about 2.0 µm, about 2.5 µm, about 3.0 µm, about 3.5 µm, about 4.0 µm, about 4.5 µm, about 5.0 µm, about 5.5 µm, about 6.0 µm, about 6.5 µm, about 7.0 µm, about 7.5 µm, about 8.0 µm, about 8.5 µm, about 9.0 µm, about 9.5 µm, about 10 µm, about 15 µm, about 20 µm, about 25 µm, about 30 µm, about 35 µm, about 40 µm, about 45 µm, about 50 µm, about 55 µm, about 60 µm, about 65 µm, about 70 µm, about 75 µm, about 80 µm, about 85 µm, about 90 µm, about 95 µm, about 100 µm, about 150 µm, about 200 µm, about 250 µm, about 300 µm, about 350 µm, about 400 µm, about 450 µm, about 500 µm, about 550 µm, about 600 µm, about 650 µm, about 700 µm, about 750 µm, about 800 µm, about 850 µm, about 900 µm, about 950 µm, about 1 mm, about 1.5 mm, about 2 mm, about 2.5 mm, about 3 mm, or any range or value therein between.

In some embodiments, a gated nanostructure device according to the present disclosure allows modulating an electric current through the film between a source electrode and a drain electrode, throughout the entire thickness of the film. In some embodiments, a gated nanostructure device allows modulating an electric current through the film between a source electrode and a drain electrode, at each point of at least one cross section of the film in a direction perpendicular or substantially perpendicular to a direction between the source electrode and the drain electrode. In some embodiments, a gated nanostructure device allows modulating an electric current through the film between a source electrode and a drain electrode, throughout the entire volume of the film. Such modulation(s) allows amplifying an electrical response of the film to chemical species in proximity to the portion of the film exposed to the external environment.

A gated nanostructure device may include a first substrate having a surface, which has at least a dielectric portion; a source electrode and a drain electrode, at least one of which is on the dielectric portion of the first substrate; a thick film (e.g., at least about 100 nm) comprising, consisting essentially of, or consisting of a conducting nanoporous material (e.g., CNTs); and a gate electrode. The conducting nanoporous material may be between the source electrode and the drain electrode in electrical contact with both the source electrode and the drain electrode. The gate electrode may be above the surface of the substrate, such that it modulates an electric current through the conducting nanoporous material throughout the entire thickness of the film and/or at each point of at least one cross section of the film in a direction perpendicular or substantially perpendicular to a direction between the source electrode and the drain electrode.

In some embodiments, both the source electrode and the drain electrode are on the dielectric portion of the surface of the substrate. Such embodiments are illustrated, for example, in FIGS. 1-8. In some embodiments, the source electrode and drain electrode are strips oriented parallel or substantially parallel to each other on the dielectric portion of the surface of the substrate, though the relative orientation of the source and drain electrodes is not limited to being parallel or substantially parallel. A distance between the outer edges of such strips may be from about 2 µm to about 3000 µm, or from about 5 µm to about 2000 µm, or from about 10 µm to about 1500 µm, or from about 20 µm to about 1000 µm, or from about 30 µm to about 500 µm, or from about 50 µm to about 300 µm, or any subrange or value within these ranges.

In some embodiments, source and drain electrodes may comprise, consist essentially of, or consist of any suitable conducting materials, such as a conducting carbon material (e.g., CNTs or graphene) or one or more metals (e.g., titanium, gold, silver, platinum, chromium, nickel, copper, palladium, aluminum, tungsten, molybdenum, manganese, cobalt, or any combination or alloy thereof). When the conducting nanoporous material (e.g., the thick film) comprises carbon nanotubes, the source and drain electrodes may be conductive materials which are compatible with high temperature processes (e.g., high temperature chemical vapor deposition (CVD) processes), which are used for making carbon nanotubes. Examples of such compatible conductive materials include, but are not limited to, platinum, molybdenum, and alloys thereof.

FIG. 2 illustrates a gated nanostructure device 200 comprising a substrate 201 having a dielectric layer 202. Source electrode 204 and drain electrode 205 are on a surface 207 of the dielectric layer 202. A conducting nanoporous film 206, such as a film made of nanotubes (e.g., CNTs) is between the source electrode 204 and the drain electrode 205 on the surface 207 of the dielectric layer 202. Pores of the conducting nanoporous material of film 206 are at least partially aligned along a direction between the source electrode 204 and the drain electrode 205, parallel or substantially parallel to the surface 207. In some embodiments, where the film 206 comprises nanotubes (e.g., CNTs), the nanotubes and their inner channels are at least partially aligned along a direction between the source electrode 204 and the drain electrode 205, parallel or substantially parallel to the surface 207.

In some embodiments, a gate electrode 203 may be a strip (a "strip gate electrode") parallel or substantially parallel to the source electrode 204 and the gate electrode 205. The strip gate electrode 203 covers the conducting nanoporous film 206 over only a portion of a distance between the source electrode 204 and the gate electrode 205, thus leaving the remaining portions 206' and 206" of the conducting nanoporous film 206 exposed to an external environment for, e.g., chemical functionalization and/or sensing applications. The gate electrode 203 may comprise, consist essentially of, or consist of any suitable electrically conducting material 209, such as a conducting carbon material (e.g., CNTs or graphene) and/or one or more metals (e.g., titanium, gold, silver, platinum, chromium, nickel, copper, palladium, aluminum, tungsten, molybdenum, manganese, cobalt, or any combination or alloy thereof). The gate electrode 203 may further comprise, consist essentially of, or consist of a dielectric material 210 (e.g., silicon oxide, silicon nitride, silicon oxynitride, or any combination thereof) which may be disposed (e.g., deposited by CVD and/or PVD) between the electrically conducting material 209 and the conducting nanoporous film 206 to provide electrical insulation between the gate electrode 203 and the conducting nanoporous film 206.

Because the strip gate electrode 203 may cover nanotubes of the conducting nanoporous film 206 throughout the thickness (a dimension in a direction perpendicular or substantially perpendicular to the dielectric surface 207) of the conducting nanoporous film 206, an electric field from the gate electrode 206 can penetrate the entire thickness of the conducting nanoporous film 206 even when the thickness is large, (e.g., at least about 100 nm, at least about 200 nm, at least about 250 nm, at least about 300 nm, or greater). Thus, a gating voltage applied to the gate electrode 203 enables modulating an electric current through the conducting nanoporous film 206 between the source electrode 204 and the drain electrode 205 throughout the entire thickness of the conducting nanoporous film 206.

In some embodiments, a gated nanostructure device according to the present disclosure (e.g., device 200 in FIG. 2) may be prepared by starting with the substrate 201. In some embodiments, the substrate may comprise, consist essentially of, or consist of any suitable semiconducting material (e.g., silicon) or any suitable dielectric material (e.g., quartz). In some embodiments, when the conducting nanoporous film 206 comprises carbon nanotubes, the substrate may comprise a material which is compatible with high temperature processes (e.g., high temperature CVD processes) which are used for producing carbon nanotubes. For example, such a high-temperature-compatible material may include, but is not limited to, silicon or quartz. In some embodiments, when the substrate comprises a semiconducting material (e.g., silicon) a dielectric layer 202 may be deposited or grown on a surface of the substrate to form a dielectric surface 207. In some embodiments, when the substrate comprises a dielectric material (e.g., quartz), deposition of a dielectric layer 202 is not necessary because the surface of the substrate is already dielectric.

In some embodiments, the dielectric layer 202 may comprise, consist essentially of, or consist of any suitable dielectric material (e.g., silicon oxide, silicon nitride, silicon oxynitride, or any combination thereof). In some embodiments, a thickness of the dielectric layer may be, for example, from about 50 nm to about 500 nm, from about 50 nm to about 100 nm, from about 100 nm to about 150 nm, from about 150 nm to about 200 nm, from about 200 nm to about 250 nm, from about 250 nm to about 300 nm, from about 300 nm to about 350 nm, from about 350 nm to about 400 nm, from about 400 nm to about 450 nm, from about 450 nm to about 500 nm, or any subrange or value therein.

In some embodiments, source electrode 204 and drain electrode 205 may be formed on the dielectric surface 207 using patterning deposition techniques known in the art. For example such techniques involve photolithography to pattern a strip shape of the source electrode 204 and drain electrode 205, followed by a deposition technique (e.g., a physical vapor deposition ("PVD"), chemical vapor deposition ("CVD"), or sputtering technique) to deposit the conducting material of the source electrode 204 and drain electrode 205. A thickness of the source electrode 204 and drain electrode 205 may vary. For example, a thickness of each of source electrode 204 and drain electrode 205 may be from about 5 nm to about 500 nm, from about 10 nm to about 400 nm, from about 20 nm to about 300 nm, from about 40 nm to about 200 nm, or any value or subrange within these ranges.

In some embodiments, a width of one or more strip electrodes, such as source electrode 204 and drain electrode 205 (i.e., a dimension parallel or substantially parallel to the surface 207 of the substrate 201, and parallel or substantially parallel to a direction between the source electrode 204 and the drain electrode 205) may vary. For example, a width of each strip electrode, such as source electrode 204 and/or drain electrode 205, may be from about 10 nm to about 1000 µm, from about 50 nm to about 800 µm, from about 100 nm to about 500 µm, from about 1 µm to about 200 µm, or from about 1 µm to about 100 µm, from about 5 µm to about 80 µm, or from about 10 µm to about 50 µm, or any subrange or value within these ranges. In some embodiments, a length of one or more strip electrodes, such as source electrode 204 and drain electrode 205 (i.e., a dimension parallel or substantially parallel to the surface 207 of the substrate 201, and perpendicular or substantially perpendicular to the direction between the source electrode 204 and the drain electrode 205), may vary, may be the same as one another, or may be different from one another.

In some embodiments, the length of the strip electrodes may be at least the same or greater than a width of the conducting nanoporous film 206 (i.e., a dimension of the conducting nanoporous film 206 parallel or substantially parallel to the surface 207 of the substrate 201, and perpendicular or substantially perpendicular to the direction between the source electrode 204 and the drain electrode 205). For example, a length of each strip electrode, such as the source electrode 204 and the drain electrode 205, may be from about 1 µm to about 10 cm, about 10 µm to about 5 cm, from about 10 µm to about 2 cm, from about 10 µm to about 1 cm, from about 10 µm to about 5 mm, from about 10 µm to about 2 mm, from about 10 µm to about 1 mm, from about 10 µm to about 500 µm, from about 10 µm to about 200 µm, from about 10 µm to about 100 µm, from about 10 µm to about 50 µm, from about 10 µm to about 20 µm, or any subrange or value within these ranges.

In some embodiments, the source electrode 204 and the drain electrode 205 may be deposited in such a way that a distance between them is equal to, greater than, or smaller than a length of conducting nanoporous film 206 (i.e., a dimension of the conducting nanoporous film 206 parallel or substantially parallel to the surface 207 of the substrate 201 and parallel or substantially parallel to the direction between the source electrode 204 and the drain electrode 205). For example, in some embodiments in which the conducting nanoporous film 206 comprises nanotubes (e.g., CNTs), the distance between the source electrode 204 and the drain electrode 205 may be equal to or smaller than an average length of the nanotubes. For example, in some embodiments, the distance between the source electrode 204 and the drain electrode 205 may be from about 100 nm to about 100 mm, from about 200 nm to about 100 mm, from about 300 nm to about 100 mm, from about 400 nm to about 100 mm, from about 500 nm to about 100 mm, from about 1 µm to about 100 mm, from about 2 µm to about 100 mm, from about 3 µm to about 100 mm, from about 10 µm to about 100 mm, from about 10 µm to about 10 mm, from about 10 µm to about 5 mm, from about 10 µm to about 1 mm, from about 100 µm to about 1 mm, or any value or subrange within these ranges.

In some embodiments, the conducting nanoporous film 206 may be deposited by any suitable method. By way of non-limiting example, in some embodiments in which the conducting nanoporous film comprises carbon nanotubes, the conducting nanoporous film may be formed using patterned deposition techniques disclosed in U.S. Provisional Application No. 62/797,063 filed Jan. 25, 2019, subsequently filed U.S. application Ser. No. 16/752,482, filed Jan. 24, 2020, and PCT International Application No. PCT/US2020/015096, filed Jan. 24, 2020, as well as in Meshot et al., *Carbon*, vol. 159, pp. 236-246 (2020), each of which is incorporated herein by reference, in its entirety. Such techniques include patterned deposition of a catalyst onto a portion of the dielectric surface 207, then growing the nanoporous thin film (e.g., CNTs) using high temperature CVD processes. In some embodiments, carbon nanotubes may be grown from catalysts and may be perpendicular or substantially perpendicular to the dielectric surface 207. In some embodiments, the catalyst for growing carbon nanotubes may be a catalyst comprising, consisting essentially of, or consisting of one or more transition metals (e.g., cobalt, nickel, iron, molybdenum, or any alloy or combination thereof, such as a Mo/Fe catalyst). In some embodiments, carbon nanostructures (e.g., CNTs) may be grown by exposing the patterned catalyst(s) to a carbon-containing gas or gas mixture (e.g., a $C_2H_2$-containing gas mixture), at an elevated temperature (e.g., 700° C. or greater). Exemplary methods of growing aligned carbon nanotubes are disclosed, for example, in Meshot et al., *Carbon*, vol. 159, pp. 236-246 (2020), which is incorporated herein by reference in its entirety In some embodiments, the grown nanotubes then can be realigned to be parallel or substantially parallel to the dielectric surface 207 so that the nanotubes and their inner channels 208 (nanopores) extend between the source electrode 204 and the drain electrode 205 to form the conducting nanoporous film 206. In some embodiments, the realignment is performed using, e.g., a rolling pin, or any other suitable alignment method. In some embodiments, the width of the conducting nanoporous film 206 may be equal to or less than the equivalent dimension of the substrate 201. In some embodiments, the width of conducting nanoporous film 206 may be from about 1 µm to about 10 cm, from about 1 µm to about 5 cm, from about 1 µm to about 2 cm, from about 1 µm to about 1 cm, from about 1 µm to about 5 mm, from about 1 µm to about 2 mm, from about 1 µm to about 1 mm, from about 1 µm to about 500 µm, from about 1 µm to about 200 µm, from about 1 µm to about 100 µm, from about 1 µm to about 50 µm, from about 1 µm to about 25 µm, from about 25 µm to about 50 µm, from about 50 µm to about 100 µm, from about 100 µm to about 200 µm, from about 200 µm to about 500 µm, or any subrange or value within these ranges.

In some embodiments, a gate electrode 203 (e.g., a strip gate electrode) may be formed over a portion of the conducting nanoporous film 206 after the nanoporous film 206 is deposited. For example, as shown in FIG. 2, portions 206' and 206" of the conducting nanoporous film 206 may be covered by a masking material (e.g., a polymeric material). Material(s) of the gate electrode 203, such as conducting material 209 and dielectric material 210, may be deposited on a portion of the conducting nanoporous film 206 not covered by the masking material. In some embodiments, dielectric material 210 may be deposited before conducting material 209. The deposition of the dielectric material 210 and the conducting material 209 may use any suitable technique (e.g., CVD, PVD, sputtering, wet colloidal techniques, or any combination thereof). In some embodiments, following the formation of the gate electrode 203, the masking material may be removed from portions 206' and 206" of the conducting nanoporous film 206, thereby exposing them to the external environment.

In some embodiments, a width of the strip gate electrode 203 (i.e., a dimension of the strip gate electrode 203 in a direction parallel or substantially parallel to the direction between the source electrode 204 and the drain electrode 205) may be any suitable width for generating an electric field within the conducting nanoporous film 206. In some embodiments, the width of the strip gate electrode 203 may be less than the distance between the source electrode 204 and the drain electrode 205. In some embodiments, the width of the strip electrode 203 may be from about 10 nm to about 3 mm, from about 10 nm to about 1 mm, from about 10 nm to about 500 µm, from about 10 nm to about 200 µm, from about 10 nm to about 100 µm, from about 10 nm to about 50 µm, from about 10 nm to about 20 µm, from about 10 nm to about 10 µm, from about 10 nm to about 5 µm, from about 10 nm to about 2 µm, from about 10 nm to about 1 µm, from about 10 nm to about 500 nm, from about 100 nm to about 3000 µm, from about 100 nm to about 1000 µm, from about 500 nm to about 500 µm, from about 1 µm to about 500 µm, or from about 1 µm to about 100 µm, or any value or subrange within these ranges.

Referring now to FIG. 3, in some embodiments, a gated nanostructure device 300 according to the present disclosure may comprise a substrate 301 having a dielectric layer 302. Source electrode 304, drain electrode 305, and additional electrode 311 may be on a dielectric surface 307 of the dielectric layer 302. A conducting nanoporous film 306, such as a film comprising nanotubes (e.g., CNTs), may include sections 306A and 306B. Section 306A, for example, is between the source electrode 304 and the additional electrode 311; and section 306B is between the additional electrode 311 and the drain electrode 305.

As shown in FIG. 3, in some embodiments, a gate electrode 303 is over section 306A of the conducting nanoporous film 306, while section 306B of the conducting nanoporous film 306 remains exposed to the external environment. In some embodiments, sections 306A and 306B may be the same as one another in size (e.g., in length and/or width). In some embodiments, sections 306A and 306B may be different from one another in size (e.g., in length and/or width). For example, in some embodiments, the additional electrode 311 may be closer to the source electrode 304 than to the drain electrode 305, such that section 306A may be shorter in the direction between the source electrode 304 and the drain electrode 305 than section 306B. In some embodiments, the additional electrode 311 may be closer to the drain electrode 305 than to the source electrode 304, such that section 306B may be shorter in the direction between the source electrode 304 and the drain electrode 305 than section 306A. A position of the additional electrode 311 may depend on the application. Because the gate electrode 303 covers section 306A of the conducting nanoporous film 306 throughout the thickness (i.e., a dimension in a direction perpendicular or substantially perpendicular to the dielectric surface 307) of the conducting nanoporous film 306, an electric field from the gate electrode 303 can penetrate the entire thickness of the conducting nanoporous film 306, even when the thickness is large (e.g., at least about 100 nm, at least about 150 nm, at least about 200 nm, at least about 250 nm, at least about 300 nm, or greater). In such configurations, a gating voltage applied to the gate electrode 303 modulates an electric current through the conducting nanoporous film 306 between the source electrode 304 and the drain electrode 305 throughout the entire thickness of the nanoporous film 306.

In some embodiments, the gated nanostructure device 300 may be prepared in a manner similar to that described for the gated nanostructure device 200 of FIG. 2. The additional electrode 311 may formed, together with the source electrode 304 and drain electrode 305, on the dielectric surface 307 using any suitable patterning and/or deposition techniques known in the art. Dimensions for the source electrode and the drain electrode, discussed above, may be also be applicable to the additional electrode 311. In some embodiments, sections 306A and 306B of the conducting nanoporous film 306 may be formed at the same time, using methods similar to those discussed above for film 206. Then section 306B of the conducting nanoporous film 306 may be covered by a masking material (e.g., a polymeric material). Material(s) of the gate electrode 303, such as conducting material 309 and dielectric material 310, may be deposited on the section 306A, which is not covered by the masking material. Dielectric material 310 may be deposited before conducting material 309 to electrically insulate gate electrode 303 from conducting nanoporous film 306. The deposition of the dielectric material 310 and the conducting material 309 may involve any suitable technique, as discussed above for device 200, including but not limited to chemical vapor deposition, physical vapor deposition, sputtering, and wet colloidal techniques. Following the formation of the gate electrode 303, the masking material may be removed from section 306B of the conducting nanoporous film 306, thereby exposing it to the external environment.

Referring now to FIG. 4, an embodiment of a gated nanostructure device 400 according to the present disclosure comprises a substrate 401 having a dielectric layer 402. Source electrode 404 and drain electrode 405 are on a surface 407 of the dielectric layer 402. A conducting nanoporous film 406, such as a film comprising nanotubes (e.g., CNTs), is between the source electrode 404 and the drain electrode 405 on the surface 407 of the dielectric layer 402. In some embodiments, at least a portion of the gate electrode 403' is inside of the conducting nanoporous film 406. When the film 406 is made of nanotubes, such as carbon nanotubes, the gate electrode 403' is inside inner channels of the nanotubes. Because the gate electrode 403' is inside pores of the conducting nanoporous film 406 throughout the entire thickness (a dimension perpendicular or substantially perpendicular to dielectric surface 407) of conducting nanoporous film 406, an electric field from the gate electrode 406 can penetrate the entire thickness of the conducting nanoporous film, even when the thickness is large (e.g., at least about 100 nm, at least about 150 nm, at least about 200 nm, at least about 250 nm, at least about 300 nm, or greater). In such configurations, a gating voltage applied to the gate electrode 406 modulates an electric current through the conducting nanoporous film 406 between the source electrode 404 and the drain electrode 405, throughout the entire thickness of the conducting nanoporous film 406.

Initial steps for preparing the gated nanostructure device 400 may be similar to the ones for preparing the gated nanostructure device 200 of FIG. 2 or device 300 of FIG. 3. Following realignment of nanotubes parallel or substantially parallel to the surface of the substrate, a conformal coating technique (e.g., atomic layer deposition) may be used to coat inner channels of the nanotubes with a dielectric material 410, followed by a conducting material 409 to form the gate electrode 403' inside the channels. Prior to the deposition of the dielectric material 410 and the conducting material 409, outer surfaces of the nanotubes forming the film 406 may be covered, by a masking material (e.g., a polymer material) or a sacrificial material to prevent deposition of the dielectric material 410 and/or the conducting material 409 on the outer surfaces of the nanotubes forming the film 406. Then, the ends of the channels of the nanotubes may be opened so that materials of the gate electrode 403', such as the dielectric material 410 and the conducting material 409, can be deposited inside the channels of the nanotubes. Such opening may be performed by etching away the masking and/or the sacrificial material from the end of the nanotubes, using known etching techniques (e.g., focused ion beam ("FIB"), laser, and/or chemical etching). In some embodiments, the dielectric material 410 inside the nanotube inner channels may have a thickness no greater than an inner channel radius. A width (diameter) of the dielectric material 410 on the gate electrode 403' inside the channels of the nanotubes may be determined by an inner diameter of the nanotubes, for which exemplary ranges and values are disclosed above.

In some embodiments, instead of solid dielectric and conducting materials, the gate electrode may comprise an ion-containing liquid, which may be inside the channels of the nanotubes.

In some embodiments, a gate electrode of a gated nanostructure device may comprise a plurality of electric field enhancing elements on a dielectric surface of a substrate and a plurality of recessed elements on the dielectric surface, wherein two adjacent electric field enhancing elements of said plurality of electric field concentrating elements are separated by a recessed element of said plurality of recessed elements and wherein the electric field enhancing elements of said plurality of electric field enhancing elements and the recessed elements of said plurality of recessed elements extend between a source electrode and a drain electrode. Such embodiments are illustrated in FIGS. 5-7 and are described below.

FIG. 5 illustrates a gated nanostructure device 500 comprising a substrate 501 having a dielectric layer 502. Source electrode 504 and drain electrode 505 are on a surface 507 of the dielectric layer 502. A trenched gate electrode 503 is on the surface 507. The gate electrode 503 includes electric field enhancing elements 511 and recessed elements 512. Recessed element 512 is between two adjacent electric field enhancing elements 511. Electric field enhancing elements 511 and recessed elements 512 extend along a direction between the source electrode 504 and the drain electrode 505 at least for a portion of a distance between the source electrode 504 and the drain electrode 505. A conducting nanoporous film 506, such as a film made of nanotubes (e.g., CNTs), is between the source electrode 504 and the drain electrode 505, over the gate electrode 503.

In some embodiments, an individual field enhancing element 511 may have a width (w) (i.e., a dimension perpendicular or substantially perpendicular to a direction between the source electrode 504 and the drain electrode 505), of about 10 nm to about 10 µm, about 20 nm to about 8 µm, about 50 nm to about 5 µm, about 80 nm to about 2 µm, about 100 nm to about 1 µm, about 200 nm to about 800 nm, or any subrange or value therein; and a height (h) (i.e., the distance between the top of a field enhancing element 511 and the top of a recessed element 512, along a dimension perpendicular or substantially perpendicular to the surface 507), of about 10 nm to about 100 µm, about 20 nm to about 80 µm, about 50 nm to about 50 µm, about 80 nm to about 20 µm, about 100 nm to about 10 µm, about 200 nm to about 8 µm, about 500 nm to about 5 µm, about 800 nm to about 2 µm, or any subrange or value therein. The trenched gate electrode 503 enhances and/or concentrates an electric field generated by applying a gating voltage to the gate electrode 503, when compared to a plain gate electrode configuration (e.g., the configuration shown in FIG. 1). Thus, the electric field from the gate electrode 503 is capable of penetrating the entire thickness of the conducting nanoporous film 506, even when the thickness is large (e.g., at least about 100 nm, at least about 150 nm, at least about 200 nm, at least about 250 nm, at least about 300 nm, or greater). In such configurations, a gating voltage applied to the gate electrode 503 modulates an electric current through the conducting nanoporous film 506 between the source electrode 504 and the drain electrode 505 throughout the entire thickness of the nanoporous film 506.

Because of the trenched nature of the gated electrode 503, a thickness of the conducting nanoporous film 506 may be non-uniform in a cross-section perpendicular or substantially perpendicular to a direction between the source electrode 504 and the drain electrode 505 (see the FIG. 5, magnified cross-sectional view). In particular, a thickness of the film 506 may be smaller over the electric field concentrating elements 511 than over recessed elements 512. In such configurations, penetration of the electric field from the gate electrode 503 throughout the entire thickness of the conducting nanoporous film 506 means that each point within the conducting nanoporous film in a cross-section perpendicular or substantially perpendicular to the direction between the source electrode 504 and the drain electrode 505 over the gate electrode 503 is penetrated by the electric field from the gate electrode 503.

The gated nanostructure device 500 may be prepared by depositing a conducting material 509 in a selected area between the area occupied by the source electrode 504 and drain electrode 505. After the conducting material 509 is deposited, conducting material 509 may be etched to form trenches, which would correspond to the areas between electric field enhancing elements 511. Etching of the conducting material 509 may be performed using any suitable technique (e.g., wet etching, such as etching with a strong base (e.g., KOH); dry etching, such as deep reactive ion etching; or any combination of known wet etching and/or dry etching techniques). Dielectric material 510 may then be deposited over etched conducting material 509 to electrically insulate the gate electrode 503 from the conducting nanoporous film 506. The dielectric material 510 may be deposited over the etched gate electrode 503 using any suitable deposition technique (e.g., CVD, PVD, sputtering, or any combination thereof). A conducting nanoporous film 506, such as a film comprising nanotubes (e.g., CNTs), may be later deposited over the gate electrode 503 between the source electrode 504 and the drain electrode 505. The remaining steps, such as forming source and drain electrodes, and depositing a conducting nanoporous film, such as a film comprising nanotubes (e.g., CNTs), can be performed in a similar manner, using similar techniques, as described above for gated nanostructure devices 100, 200, 300, and 400 in FIGS. 1-4.

FIG. 6 illustrates a gated nanostructure device 600 comprising a substrate 601 having a dielectric layer 602. Source electrode 604 and drain electrode 605 are on a surface 607 of the dielectric layer 602. A ridge gate electrode 603 is on the surface 607. The gate electrode includes rectangular electric field enhancing elements 611 and recessed elements 612. Recessed element 612 is between two adjacent electric field concentrating elements 611. Electric field enhancing elements 611 and recessed elements 612 extend in a direction between the source electrode 604 and the drain electrode 605 at least for a portion of a distance between the source electrode 604 and the drain electrode 605. A conducting nanoporous film 606, such as a film made of nanotubes (e.g., CNTs), is between the source electrode 604 and the drain electrode 605 over the gate electrode 603.

In some embodiments, an individual field enhancing element 611 may have a width (w), (i.e., a dimension perpendicular or substantially perpendicular to a direction between the source electrode 604 and the drain electrode 605), of about 0.01 µm to about 10 µm, about 0.02 µm to about 8 µm, about 0.05 µm to about 5 µm, about 0.08 µm to about 2 µm, about 0.1 µm to about 1 µm, or any subrange or value therein; and a height (h) (i.e., a dimension perpendicular or substantially perpendicular to the surface 607 from the recessed element 611) of about 0.01 µm to about 100 µm, about 0.02 µm to about 80 µm, about 0.05 µm to about 50 µm, about 0.08 µm to about 20 µm, about 0.1 µm to about 10 µm, about 0.2 µm to about 8 µm, about 0.5 µm to about 5 µm, about 0.8 µm to about 2 µm, or any subrange or value therein. The ridge gate electrode 603 enhances and/or concentrates an electric field generated by applying a gating voltage to the gate electrode 603, compared to a plain gate electrode (e.g., the configuration shown in FIG. 1). Thus, the electric field from the gate electrode 603 is capable of penetrating the entire thickness of the conducting nanoporous film 606 even when the thickness is large (e.g., at least about 100 nm, at least about 150 nm, at least about 200 nm, at least about 250 nm, at least about 300 nm, or greater). In such configurations, a gating voltage applied to the gate electrode 603 may modulate an electric current through the conducting nanoporous film 606 between the source electrode 604 and the drain electrode 605 throughout the entire thickness of the conducting nanoporous film 606.

Referring still to FIG. 6, because of the trenched nature of the gated electrode 603, a thickness of the conducting nanoporous film 606 may be non-uniform in a cross-section perpendicular or substantially perpendicular to a direction between the source electrode 604 and the drain electrode 605 (see FIG. 6, magnified cross-sectional view). In particular, a thickness of the film may be smaller over the electric field concentrating elements 611 than over recessed elements 612. In such configurations, penetration by the electric field from the gate electrode 603 of the entire thickness of the conducting nanoporous film 606 means that each point of the conducting nanoporous film in a cross-section perpendicular or substantially perpendicular to the direction between the source electrode 604 and the drain electrode 605 over the gate electrode 603 is penetrated by the electric field from the gate electrode 603.

The gated nanostructure device 600 may be prepared similarly to the gated nanostructure device 500. However, the etching (e.g., deep reactive ion etching), of the conducting material 609 may be combined with a patterning technique (e.g., lithographic patterning) to form rectangular electric field enhancing elements 611 and recessed elements 612 of the ridge gate electrode 603. Alternatively, instead of etching, a deposition technique (e.g., physical vapor deposition) may be combined with a patterning technique (e.g., lithographic patterning) to form the ridge gate electrode 603 on the substrate.

FIG. 7 illustrates a gated nanostructure device 700 comprising a substrate 701 having a dielectric layer 702. Source electrode 704 and drain electrode 705 are on a surface 707 of the dielectric layer 702. A spike gate electrode 703 is on the surface 707. The gate electrode 703 includes electric field enhancing elements 711 and recessed elements 712. Recessed element 712 is between two adjacent electric field concentrating elements 711. Electric field enhancing elements 711 and recessed elements 712 extend in a direction between the source electrode 704 and the drain electrode 705 at least for a portion of a distance between the source electrode 704 and the drain electrode 705. A conducting nanoporous film 706, such as a film made of nanotubes (e.g., CNTs), is between the source electrode 704 and the drain electrode 705 over the gate electrode 703.

Referring still to FIG. 7, in some embodiments, an individual electric field enhancing element 711 is a linear array, which includes elevated sub-elements 713 (spikes) and recessed sub-elements 714. Adjacent elevated sub-elements 713 are separated by a recessed sub-element 714. In some embodiments, recessed sub-elements 714 of electric field enhancing element 711 may be at the same level in a direction perpendicular or substantially perpendicular to the surface 707 as recessed elements 712. An individual elevated sub-element 713 may have a width (w) (i.e., a dimension perpendicular or substantially perpendicular to a direction between the source electrode 704 and the drain electrode 705), of about 0.01 µm to about 10 µm, about 0.02 µm to about 8 µm, about 0.05 µm to about 5 µm, about 0.08 µm to about 2 µm, about 0.1 µm to about 1 µm, or any subrange or value therein; and a height (h) (i.e., a dimension perpendicular or substantially perpendicular to the surface 707 from the recessed element 712, of about 0.01 µm to about 100 µm, about 0.02 µm to about 80 µm, about 0.05 µm to about 50 µm, about 0.08 µm to about 20 µm, about 0.1 µm to about 10 µm, about 0.2 µm to about 8 µm, about 0.5 µm to about 5 µm, about 0.8 µm to about 2 µm, or any subrange or value therein. The value p, which is a sum of w (the width of an individual elevated sub-element 713 of electric field enhancing element 711) and a width of an individual recessed element 712, may be at least 2w or greater.

In some embodiments, the spike gate electrode 703 enhances and/or concentrates an electric field generated by applying a gating voltage to the gate electrode 703 compared to a plain gate electrode configuration (e.g., the configuration shown in FIG. 1). Thus, the electric field from the gate electrode 703 is capable of penetrating the entire thickness of the conducting nanoporous film 706 even when the thickness is large (e.g., at least about 100 nm, at least about 150 nm, at least about 200 nm, at least about 250 nm, at least about 300 nm, or greater). A gating voltage applied to the gate electrode 703 modulates an electric current through the conducting nanoporous film 706 between the source electrode 704 and the drain electrode 705 throughout the entire thickness of the conducting nanoporous film 706.

Because of the spike nature of the gated electrode 703, a thickness of the conducting nanoporous film 706 may be non-uniform in a cross-section perpendicular or substantially perpendicular to a direction between the source electrode 704 and the drain electrode 705 over elevated sub-elements 713 and recessed sub-elements 714 (see top view and magnified cross-sectional view in FIG. 7). In particular, a thickness of the film may be smaller over the elevated elements 713 of electric field concentrating elements 711 than over recessed elements 712. In such configurations, penetration by the electric field from the gate electrode 703 of the entire thickness of the conducting nanoporous film 706 means that each point of the conducting nanoporous film in a cross-section perpendicular or substantially perpendicular to the direction between the source electrode 704 and the drain electrode 705 over the elevated sub-elements 713 of the gate electrode 703 is penetrated by the electric field from the gate electrode 703.

The gated nanostructure device 700 may be prepared in a manner similar to the gated nanostructure devices 500 and 600 (FIGS. 5 & 6). However, the etching (e.g., deep reactive ion etching) may be combined with a patterning technique (e.g., lithographic patterning) to form the spike gate electrode 703. Alternatively, instead of etching, a deposition technique (e.g., physical vapor deposition) may be combined with a patterning technique (e.g., lithographic patterning) to form the spike gate electrode 703 on the substrate.

FIG. 8 illustrates a gated nanostructure device 800 comprising a substrate 801 having a dielectric layer 802. Source electrode 804 and drain electrode 805 are on a surface 807 of the dielectric layer 802. A gate electrode 803 extends over the surface 807 between the source electrode 804 and the drain electrode 805. Although FIG. 8 shows the gate electrode 803 as a pillar, it may have other shapes. A conducting nanoporous film 806, such as a film made of nanotubes (e.g., CNTs), curves over the gate electrode 803 between the source electrode 804 and the drain electrode 805. Pores of the conducting nanoporous film 806 may be at least partially aligned in a direction parallel or substantially parallel to the direction between the source electrode 804 and the drain electrode 805 along the surface 807. In other words, the pores of the conducting nanoporous film 806 have a non-zero projection in the direction parallel or substantially parallel to the direction between the source electrode 804 and the drain electrode 805 along the surface 807.

The gated nanostructure device 800 may be prepared by forming a source electrode 804 and a drain electrode 805 on a dielectric surface of a substrate 801 in a manner similar to the source and drain electrode formation for devices 100, 200, 300, 400, 500, 600, and 700 (FIGS. 1-7). A gate electrode 803 extending from the surface of the substrate may be formed prior to the formation of the source 804 and drain 805 electrodes using combination of one or more patterning techniques (e.g., photolithography) and one or more etching techniques (e.g., wet etching and/or dry etching, such as plasma etching) to define a shape of electrode 803 using a material, such as a semiconducting or dielectric material of the substrate 801. A height of the gate electrode may be selected to match a curvature of the curved conducting nanoporous film 806. FIG. 8 shows the gate electrode 803 having a pillar shape. Material(s) of the gate electrode 803, such as conducting material 809 and dielectric material 810, may be then deposited over the material of the substrate 801 defining the shape of the gate electrode 803. The dielectric material 810 electrically insulates the conducting material 809 of the gate electrode 803 from the curved conducting nanoporous film 806.

The curved conducting nanoporous film 806, such as a curved film made of nanotubes (e.g., CNTs), may be formed, for example, by patterning catalyst(s) on the source and drain electrodes. Methods for growing curved carbon nanotube films is disclosed, for example, in M. De Volder, et al., Nature Commun. vol. 5, p. 4512 (2014), hereby incorporated by reference in its entirety.

The gated nanostructure device 800 provides gating while leaving surfaces of the conducting nanoporous film 806 maximally exposed to an external environment, for, e.g., sensing applications and/or chemical functionalization. Gate electrode 803 provides an electric field that penetrates an entire cross section or thickness of the conducting nanoporous film 806. In such configurations, a gating voltage applied to the gate electrode 803 modulates a current through the conducting nanoporous film 806 between the source electrode 804 and the drain electrode 805 throughout the entire cross section or thickness of the conducting nanoporous film 806.

The height (h) of the gate electrode 803 may be tailored to the intended application. In some embodiments, the height of gate electrode 803 may be from about 0.01 µm to about 100 µm, about 0.02 µm to about 80 µm, about 0.05 µm to about 50 µm, about 0.08 µm to about 20 µm, about 0.1 µm to about 10 µm, about 0.2 µm to about 8 µm, about 0.5 µm to about 5 µm, about 0.8 µm to about 2 µm, or any subrange or value therein. Additionally, the upper surface of the gate electrode 803 may include trenches, ridges and/or spikes, similar to those discussed for gate electrodes 503, 603, and 703 (FIGS. 5-7).

FIG. 9 illustrates a gated nanostructure device 900 comprising a first substrate 901 and a second substrate 921. A source electrode 904 is on dielectric surface 907 of first substrate 901. A drain electrode 905 is on dielectric portion 927 of a surface 923 of second substrate 921, which faces the first substrate 901. Conducting nanoporous film 906, which may comprise, consist essentially of, or consist of nanotubes (e.g., CNTs), extends between the first substrate 901 and the second substrate 921 and is electrically connected to the drain electrode 905 and the source electrode 904. The drain electrode 905 on the second substrate 921 and the source electrode 904 of the first substrate 901 may be aligned with respect to each other. The second substrate 921 has a gate electrode 903 extending from the surface 923 of the second substrate 921 through an opening in the drain electrode 905 towards the first substrate 901 at least through a portion of a length of the conducting nanoporous film 906 between the source electrode 904 and the drain electrode 905. The gate electrode 903 has dimensions not exceeding those of conducting nanoporous film 906.

Cross sections of gate electrode 903, source electrode 904, drain electrode 905 and conducting nanoporous film 906 may vary. By way of non-limiting example, FIG. 9 illustrates cross sections of gate electrode 903, source electrode 904, drain electrode 905 and conducting nanoporous film 906 as being circular and concentric. Circular and concentric cross sections for gate electrode 903 and conducting nanoporous film 906 allows a more uniform penetration of an electric field from gate electrode 903 throughout the conducting nanoporous film 906.

The gated nanostructure device 900 may be prepared by forming a source electrode 904 of dielectric surface 907 of first substrate 901. The source electrode 904 may have a thickness from about 5 nm to about 1000 nm, from about 8 nm to about 800 nm, from about 5 nm to about 500 nm, from about 2 nm to about 200 nm, or any value or subrange within these ranges. Lateral dimensions of the source electrode 904 (i.e., dimensions parallel or substantially parallel to the surface 907) may be selected to match or to exceed those of the conducting nanoporous film 906. The source electrode

904 may comprise one or more conducting materials, such as one or more metals (e.g., titanium, gold, silver, platinum, chromium, nickel, copper, palladium, aluminum, tungsten, molybdenum, manganese, cobalt, or any combination or alloy thereof) and/or one or more conductive carbon materials (e.g., graphite, graphene). When the conducting nanoporous film 906 is made of carbon nanotubes, a conducting material of the source electrode 904 may be a conducting material compatible with high temperature processes used for growing carbon nanotubes. Examples of such compatible materials include, but are not limited to, e.g., platinum, molybdenum, and alloys thereof.

Following formation of the source electrode 904, nanoporous conducting film 906 may be formed on source electrode 904, such that pores of the nanoporous conducting material in film 906 are directed perpendicular or substantially perpendicular to a surface of electrode 904 and surface 907. When the conducting nanoporous film 906 is made of carbon nanotubes, carbon nanotubes aligned perpendicular or substantially perpendicular to the surface of source electrode 904 may be grown on source electrode 904 using patterned deposition techniques disclosed in U.S. Provisional Application No. 62/797,063, filed Jan. 25, 2019, subsequently filed U.S. non-provisional application Ser. No. 16/752,482, filed Jan. 24, 2020, and PCT International Application No. PCT/US2020/015096, filed Jan. 24, 2020, as well as in Meshot et al., *Carbon*, vol. 159, pp. 236-246 (2020), each of which is incorporated herein by reference in its entirety. Such techniques may involve patterned deposition of a catalyst on a portion of the dielectric surface 907, then growing (using, e.g., a high temperature CVD process) from the catalyst particles on the dielectric surface 907 carbon nanotubes that are perpendicular or substantially perpendicular to the dielectric surface 907. In some embodiments, the catalyst for growing carbon nanotubes may be a catalyst comprising one or more transition metals (e.g., cobalt, nickel, iron, molybdenum, or combinations or alloys thereof, such as a Mo/Fe catalyst). The carbon nanotubes may be grown by exposing the patterned catalyst to a carbon-containing gas or gas mixture (e.g., a $C_2H_2$-containing gas mixture), at an elevated temperature (e.g., 700° C. or higher). Methods of growing aligned carbon nanotubes are disclosed, for example, in Meshot et al., *Carbon*, vol. 159, pp. 236-246 (2020), which is incorporated herein by reference in its entirety.

On separate second substrate 921, gate electrode 903 may be formed with dimensions not exceeding dimensions of conducting nanoporous film 906. For example, a length (i.e., a dimension perpendicular or substantially perpendicular to the surface of the second substrate 921) of gate electrode 903 may be at least 50% but no more than 100%, at least 60% but no more than 100%, at least 70% but no more than 100%, at least 80% but no more than 100%, at least 90% but no more than 100%, or at least 95% but no more than 100% of a length of conducting nanoporous film 903 (i.e., a direction perpendicular or substantially perpendicular to surface 907 of first substrate 901). The length of conducting nanoporous film 906, such as a film made of nanotubes (e.g., CNTs) may be, for example, from about 1 µm to about 100 mm, from 10 µm to about 10 mm, from 100 µm to 1 mm, or any subrange or value within these ranges.

Lateral dimensions of the gate electrode 903 may be less than or equal to the lateral dimensions of conducting nanoporous films 906. For example, when the gate electrode 903 and the conducting nanoporous film 906 have circular cross sections, a diameter of a cross section of the gate electrode 903 is equal to or less than a diameter (d) of a cross section of conducting nanoporous film 906. Specific lateral dimensions of the gate electrode 903 and conducting nanoporous film 906 may vary. The lateral dimension(s), such as a diameter, of the gate electrode 903 (see e.g., w in FIG. 9), may be from about 0.01 µm to about 1000 µm, about 0.02 µm to about 800 µm, about 0.05 µm to about 500 µm, about 0.08 µm to about 200 µm, about 0.1 µm to about 100 µm, about 0.2 µm to about 80 µm, about 0.5 µm to about 50 µm, about 1 µm to about 20 µm, about 2 µm to about 10 µm, or any subrange or value therein. The lateral dimension(s), such as a diameter, of conducting nanoporous film 906 (see e.g., d in FIG. 9), may be from about 0.01 µm to about 10,000 µm, about 0.02 µm to about 8000 µm, about 0.05 µm to about 5000 µm, about 0.08 µm to about 2000 µm, about 0.1 µm to about 1000 µm, about 0.2 µm to about 800 µm, about 0.5 µm to about 500 µm, about 0.8 µm to about 200 µm, about 1 µm to about 100 µm, about 2 µm to about 80 µm, about 5 µm to about 50 µm, or about 10 µm to about 20 µm, or any subrange or value therein. The thickness of conducting nanoporous film 906, which may be a distance between gate electrode 903 and the outside edge of conducting nanoporous film 906 in a direction perpendicular or substantially perpendicular to a direction between the first substrate 901 and the second substrate 921 (or the direction between the source electrode 904 and the drain electrode 905) may be from about 0.040 µm to about 5000 µm, about 0.05 µm to about 4000 µm, about 0.10 µm to about 2000 µm, about 0.10 µm to about 1000 µm, about 0.2 µm to about 800 µm, about 0.5 µm to about 500 µm, about 0.8 µm to about 200 µm, about 1 µm to about 100 µm, about 2 µm to about 80 µm, about 5 µm to about 50 µm, or about 10 µm to about 20 µm (or any subrange or value therein).

The gate electrode 903 may be formed on the second substrate 921 using a combination of one or more patterning techniques (e.g., photolithography) and/or one or more etching techniques (e.g., wet etching, dry etching, such as plasma etching) to define a shape of electrode 903 using a material, such as a semiconducting or dielectric material of the substrate 921. Material(s) of the gate electrode 903, such as conducting material 909 and dielectric material 910 may then be deposited over the material of the substrate 921 defining the shape of the gate electrode 903. The dielectric material 910 electrically insulates the conducting material 909 of the gate electrode 903 from the conducting nanoporous film 906. One or more etching techniques may be used to remove the material of the substrate 921 outside the area patterned for the gate electrode 903.

Referring still to FIG. 9, the etched portion of the surface of the substrate 921 may have a dielectric layer portion 927. A drain electrode 905 may be formed on the dielectric layer portion 927 around the gate electrode 903. The dielectric layer may extend over the gate electrode 903 to insulate the gate electrode from the conducting nanoporous film 906. The drain electrode 904 may be formed using a combination of one or more patterning techniques (e.g., photolithography) and one or more deposition techniques (e.g., physical vapor deposition or sputtering). In some embodiments, the drain electrode 905 may have an outside contour matching that of the source electrode 904. For example, when the outside contour of the source electrode 904 is a circle, the outside contour of the drain electrode 905 may also be a circle of the same diameter as source electrode 904. Since the drain electrode 905 provides electrical contact with the conducting nanoporous film 906, lateral dimensions of the outside contour of the drain electrode 905 may be equal to or greater than those of the cross section of conducting nanoporous film 906.

The second substrate 921 having the gate electrode 903 and the drain electrode 905 may be brought together with the first substrate 901 having the source electrode 904 and the conducting nanoporous film 906 (e.g., a film comprising CNTs and/or other nanotubes), such that the drain electrode 905 forms an electrical contact with the conducting nanoporous film 906 and the gate electrode 903 penetrates at least a portion of the length of conducting nanoporous film 906. A portion of the conducting nanoporous film 906 penetrated by the gate electrode 903 is essentially crashed or compacted by the gate electrode 903.

In the gated nanostructure device 900, an electric field generated by applying a gate voltage to the gate electrode 903 uniformly penetrates the entire volume of the conducting nanoporous film 906. In such configurations, a gating voltage applied to the gate electrode 903 modulates an electric current through the conducting nanoporous film 906 between the source electrode 904 and the drain electrode 905 throughout the entire volume of the conducting nanoporous film 906. In such embodiments, the conducting nanoporous film 906 remains exposed to an external environment for, e.g., sensing applications and/or chemical functionalization.

FIG. 10 illustrates another embodiment of a gated nanostructure device according to the present disclosure. Gated nanostructure device 1000 is similar to the gated nanostructure device 900 in FIG. 9. In contrast to the gate electrode 903 of device 900, the gate electrode 1003 of device 1000 includes multiple gate elements 1003' extending from the second substrate 1021.

The gated nanostructure device 1000 comprises a first substrate 1001 and a second substrate 1021. A source electrode 1004 is on dielectric surface 1007 of first substrate 1001. A drain electrode 1005 is on dielectric portion 1027 of a surface 1023 of second substrate 1021, which faces the first substrate 1001. Conducting nanoporous film 1006 may be a film comprising nanotubes (e.g., CNTs) and extends between the first substrate 1001 and the second substrate 1021. Film 1006 is electrically connected to the drain electrode 1005 and the source electrode 1004. The drain electrode 1005 on the second substrate 1021 and the source electrode 1004 of the first substrate 1001 may be aligned with respect to one another. The second substrate 1021 has a gate electrode 1003, which includes multiple elements 1003' extending from the surface 1023 of the second substrate 1021 through one or more openings in the drain electrode 1005 towards the first substrate 1001, and at least through a portion of a length of the conducting nanoporous film 1006 between the source electrode 1004 and the drain electrode 1005.

In some embodiments, the gate elements 1003' of the gate electrode 1003 may form a regularly spaced array. For example, in FIG. 10, the elements 1003' of the gate electrode 1003 form a hexagonal or triangular array. However, in some embodiments, the gate elements 1003' need not be regularly arranged (e.g., may be randomly arranged). The gate electrode 1003 may have dimensions not exceeding those of conducting nanoporous film 1006 (e.g., diameter (d)).

The gated nanostructure device 1000 may be prepared in a manner similar to that used to prepare the gated nanostructure device 900. However, for device 1000, the combination of one or more patterning techniques (e.g., photolithography) and one or more etching techniques (e.g., wet etching, dry etching, such plasma etching) may be used to form multiple gate elements 1003' of the gate electrode 1003 (see FIG. 10) instead of a single element of the gate electrode 903 (see FIG. 9).

In the gated nanostructure device 1000, an electric field generated by applying a gating voltage to gate electrode 1003, including gate elements 1003', uniformly penetrates the entire volume of the conducting nanoporous film 1006. In such configurations, a gating voltage applied to the gate electrode 1003 modulates an electric current through conducting nanoporous film 1006 between the source electrode 1004 and the drain electrode 1005 throughout the entire volume of the conducting nanoporous film 1006. In some embodiments, the conducting nanoporous film 1006 remains exposed to an external environment for, e.g., sensing applications and/or chemical functionalization.

FIG. 11 illustrates another embodiment of a gated nanostructure according to the present disclosure. Gated nanostructure device 1100 comprises a first substrate 1101 and a second substrate 1121. A source electrode 1104 is on dielectric surface 1107 of first substrate 1101. Conducting nanoporous film 1106, such as a film made of nanotubes (e.g., CNTs), extends between the source electrode 1104 and a drain electrode 1105, which is on a surface 1122 of the second substrate 1121, which is opposite to a surface 1123 of the second substrate, the surface 1123 facing the first substrate 1101.

The second substrate 1121 includes one or more openings 1124 through its thickness with dimensions accommodating conducting nanoporous film 1106. When conducting nanoporous film 1106 has a circular cross section (e.g., as in FIG. 11), the second substrate 1121 may have a circular opening 1124 with a diameter of equal to or greater than a diameter (d) of the cross section of conducting nanoporous film 1106, such that opening 1124 accommodates film 1106. Conducting nanoporous film 1106 is in electrical contact with the source electrode 1104 and a drain electrode 1105. A gate electrode 1103 extends from the surface 1122 of the second substrate 1121 at least through a portion of a length of the conducting nanoporous film 1106 between the source electrode 1104 and the drain electrode 1105.

Non-limiting ranges for dimensions w and d in FIG. 11 may be from about 0.01 µm to about 1000 µm, from about 0.01 µm to about 500 µm, from about 0.01 µm to about 200 µm, from about 0.01 µm to about 100 µm, from about 0.01 µm to about 50 µm, from about 0.01 µm to about 20 µm, from about 0.01 µm to about 10 µm, from about 0.1 µm to about 1000 µm, from about 0.1 µm to about 500 µm, from about 0.1 µm to about 200 µm, from about 0.1 µm to about 100 µm, from about 0.1 µm to about 50 µm, from about 0.1 µm to about 20 µm, from about 0.1 µm to about 10 µm, from about 1 µm to about 1000 µm, from about 1 µm to about 500 µm, from about 1 µm to about 200 µm, from about 1 µm to about 100 µm, from about 1 µm to about 50 µm, from about 1 µm to about 20 µm, from about 1 µm to about 10 µm, from about 10 µm to about 1000 µm, from about 10 µm to about 500 µm, from about 10 µm to about 200 µm, from about 10 µm to about 100 µm, from about 10 µm to about 50 µm, from about 10 µm to about 20 µm, or any subrange or value within these ranges.

The gated nanostructure device 1100 may be prepared by forming a source electrode 1104 on the substrate 1101, then forming a conducting nanoporous film 1106 in a manner similar of that described for preparation of the gated nanostructure devices 900 and 1000. A gated electrode 1103 and an opening 1124 may be formed in second substrate 1121 through a combination of one or more patterning techniques (e.g., photolithography) and one or more etching techniques (e.g., wet etching and/or dry etching, such as plasma etching). Lateral dimensions of the opening 1124 are selected such that the 1124 is configured to accommodate the conducting nanoporous film 1106 extending from the source electrode 1104 on the first substrate 1101.

In some embodiments, at least one of the lateral dimensions of the gate electrode 1103 is smaller than a lateral dimension (e.g., diameter (d)) of a cross section of the conducting nanoporous film 1106. In FIG. 11, a lateral dimension (w) of the gate electrode 1103 is smaller than a diameter (d) of the cross section of the conducting nanoporous film 1106. A second lateral dimension perpendicular or substantially perpendicular to w may or may not be smaller than a lateral dimension, such as a diameter (d), of the cross section of the conducting nanoporous film 1106. As shown in FIG. 11 (B-B' cross section), such a second lateral dimension may be greater than the diameter (d) of the cross section of the conducting nanoporous film 1106. A length of the gate electrode 1103 (i.e., a dimension perpendicular or substantially perpendicular to the surface of the second substrate 1121) preferably does not exceed a length of the conducting nanoporous film 1106. The length of the gated electrode 1103 may have a relationship to the length of the conducting nanoporous film 1106 (e.g., at least 50% but no more than 100% of the length of the conducting nanoporous film) similar to that discussed above for the length of the gate electrode 903 and the length of the conducting nanoporous film 906 in device 900.

The gate electrode 1103 may be formed using combination of one or more patterning techniques (e.g., photolithography) and one or more etching techniques (e.g., wet etching, dry etching such as plasma etching, etc.) to define its shape and dimensions. Gate electrode 1103 may be formed from any suitable material, such as a semiconducting or dielectric material, including that of the second substrate 1121. The material(s) constituting the gate electrode 1103, such as conducting material 1109 and dielectric material 1110 may be then deposited over the material of the substrate 1121 defining the shape of the gate electrode 1103. The dielectric material 1110 electrically insulates the conducting material 1109 of the gate electrode 1103 from the conducting nanoporous film 1106.

The second substrate 1121, including the gate electrode 1103 and opening 1124 may be brought together with the first substrate 1101, which includes the source electrode 1104 and the conducting nanoporous film 1106, such that the gate electrode 1103 penetrates at least a portion of the length of conducting nanoporous film 1106. A portion of the conducting nanoporous film 1106 penetrated by the gate electrode 1103 is essentially crashed or compacted by gate electrode 1103. A drain electrode 1105 may then be deposited on surface 1122 of the second substrate 1121 over the opening 1124 to establish an electrical contact with conducting nanoporous film 1106. The drain electrode 1105 may be deposited using any suitable deposition technique, as discussed above, using any suitable conductive material (e.g., a metal or conductive carbon material such as graphene).

In some embodiments, in gated nanostructure device 1100, an electric field generated by applying a gating voltage the gate electrode 1103 penetrates the entire volume of the conducting nanoporous film 1106. Thus, a gating voltage applied to the gate electrode 1103 modulates an electric current through the conducting nanoporous film 1106 between the source electrode 1104 and the drain electrode 1105 throughout the entire volume of the conducting nanoporous film 1106. Meanwhile, the conducting nanoporous film 1106 remains exposed to an external environment for, e.g., sensing applications or chemical functionalization.

Gated nanostructure devices, as disclosed above, may be used as sensing devices configured to detect a chemical species in the external environment upon a exposure of the exposed portion of the conducting nanoporous material to a chemical or biological species of interest. For example, gated nanostructure devices according to the present disclosure may be used for detecting a chemical species in, e.g., the external environment by exposing the exposed portion of the conducting nanoporous material of the gated nanostructure device to one or more chemical or biological species of interest to generate an electrical response in the conducting nanoporous material and modulating the electric current through the conducting nanoporous material between the source electrode and the drain electrode by applying a gating voltage to the gate electrode to amplify the electrical response.

While certain embodiments have been illustrated and described, a person with ordinary skill in the art, after reading the foregoing specification, can effect changes, substitutions of equivalents and other types of alterations to the present technology as set forth herein. Each aspect and embodiment described above can also have included or incorporated therewith such variations or aspects as disclosed in regard to any or all of the other aspects and embodiments.

The present technology is also not to be limited in terms of the particular aspects described herein, which are intended as single illustrations of individual aspects of the present technology. Many modifications and variations of this present technology can be made without departing from its spirit and scope, as will be apparent to those skilled in the art. Functionally equivalent methods within the scope of the present technology, in addition to those enumerated herein, will be apparent to those skilled in the art from the foregoing descriptions. Such modifications and variations are intended to fall within the scope of the appended claims. It is to be understood that this present technology is not limited to particular methods, reagents, compounds or compositions, which can, of course, vary. It is also to be understood that the terminology used herein is for the purpose of describing particular aspects only, and is not intended to be limiting. Thus, it is intended that the specification be considered as exemplary only with the breadth, scope and spirit of the present technology indicated only by the appended claims, definitions therein and any equivalents thereof.

The embodiments, illustratively described herein may suitably be practiced in the absence of any element or elements, limitation or limitations, not specifically disclosed herein. Thus, for example, the terms "comprising," "including," "containing," etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the claimed technology. Additionally, the phrase "consisting essentially of" will be understood to include those elements specifically recited and those additional elements that do not materially affect the basic and novel characteristics of the claimed technology. The phrase "consisting of" excludes any element not specified.

In addition, where features or aspects of the disclosure are described in terms of Markush groups, those skilled in the art will recognize that the disclosure is also thereby described in terms of any individual member or subgroup of members of the Markush group. Each of the narrower species and subgeneric groupings falling within the generic disclosure also form part of the invention. This includes the generic description with a proviso or negative limitation removing any subject matter from the genus, regardless of whether or not the excised material is specifically recited herein.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like, include the number recited and refer to ranges which can be subsequently broken down into subranges as discussed above. Finally, as will be understood by one skilled in the art, a range includes each individual member.

All publications, patent applications, issued patents, and other documents (for example, journals, articles and/or textbooks) referred to in this specification are herein incorporated by reference as if each individual publication, patent application, issued patent, or other document was specifically and individually indicated to be incorporated by reference in its entirety. Definitions that are contained in text incorporated by reference are excluded to the extent that they contradict definitions in this disclosure.

Although the figures and description may illustrate a specific order of method steps, the order of such steps may differ from what is depicted and described, unless specified differently above. Also, two or more steps may be performed concurrently or with partial concurrence, unless specified differently above.

It is important to note that any element disclosed in one embodiment may be incorporated or utilized with any other embodiment disclosed herein. Although only one example of an element from one embodiment that can be incorporated or utilized in another embodiment has been described above, it should be appreciated that other elements of the various embodiments may be incorporated or utilized with any of the other embodiments disclosed herein. Unless the context indicates otherwise, it is specifically intended that the various features of the technology described herein can be used in any combination. Moreover, the disclosure also contemplates that in some embodiments, any feature or combination of features set forth herein can be excluded or omitted. To illustrate, if the specification states that a complex comprises components A, B and C, it is specifically intended that any of A, B or C, or a combination thereof, can be omitted and disclaimed singularly or in any combination.

Other embodiments are set forth in the following claims, along with the full scope of equivalents to which such claims are entitled.

What is claimed is:

1. A gated nanostructure device comprising:
a first substrate having a dielectric layer;
a source electrode and a drain electrode, wherein at least one of the source electrode and the drain electrode is on the dielectric layer of the first substrate;
a thick film comprising conducting carbon nanotubes between the source electrode and the drain electrode, wherein each carbon nanotube has an inner channel; and
a gate electrode above the dielectric layer of the first substrate, wherein the gate electrode modulates an electric current through the conducting carbon nanotubes between the source electrode and the drain electrode throughout a thickness of the thick film;
wherein the conducting carbon nanotubes comprise an exposed portion, which is exposed to an outside environment, and the inner channels of the conducting carbon nanotubes are at least partially aligned along a direction that is substantially parallel to a direction between the source electrode and the drain electrode.

2. The gated nanostructure device of claim 1, wherein the thick film has a thickness of at least about 100 nm.

3. The gated nanostructure device of claim 1, wherein the source electrode and the drain electrode are on the dielectric layer of the first substrate.

4. The gated nanostructure device of claim 3, wherein the thick film is on the dielectric layer of the first substrate and the inner channels of the carbon nanotubes are aligned substantially parallel to the dielectric layer of the first substrate.

5. The gated nanostructure device of claim 4, wherein the gate electrode is a strip covering a portion of the conducting carbon nanotubes.

6. The gated nanostructure device of claim 4, further comprising an additional electrode between the source electrode and the drain electrode and wherein the conducting carbon nanotubes comprise:
(i) a first section between the source electrode and the additional electrode; and
(ii) a second section between the additional electrode and the drain electrode;
wherein the gate electrode is on one of the first section and the second section and the other of the first section and the second section includes the exposed portion.

7. The gated nanostructure device of claim 1, wherein the gate electrode is inside of the inner channel of one or more of the conducting carbon nanotubes.

8. The gated nanostructure device of claim 4, wherein the gate electrode comprises a plurality of electric field enhancing elements on the dielectric layer and a plurality of recessed elements on the dielectric layer, wherein two adjacent electric field concentrating elements of said plurality of electric field enhancing elements are separated by a recessed element of said plurality of recessed elements and wherein the electric field enhancing elements of said plurality of electric field enhancing elements and the recessed elements of said plurality of recessed elements extend between the source electrode and the drain electrode.

9. The gated nanostructure device of claim 8, wherein a dimension of an individual electric field enhancing element of said plurality of electric field enhancing elements in a direction, which is parallel to the dielectric surface and perpendicular to a direction between the source electrode and the drain electrode, is from about 0.01 µm to about 10 µm and a dimension of an individual electric field enhancing element of said plurality of electric field enhancing elements, which is perpendicular to the dielectric layer, is from about 0.01 µm to about 100 µm.

10. The gated nanostructure device of claim 8, wherein an individual electric field enhancing element of said plurality of electric field concentrating elements is an array comprising a plurality of elevated sub-elements and a plurality of recessed sub-elements, such that two adjacent elevated sub-elements of the plurality of elevated sub-elements are separated by a recessed sub-element of said plurality of recessed sub-elements in the direction between the source electrode and the drain electrode.

11. The gated nanostructure device of claim 3, wherein the gate electrode extends over the dielectric layer of the first substrate and the thick film is a curved film over the gate electrode between the source electrode and the drain electrode.

12. The gated nanostructure device of claim 1, further comprising a second substrate comprising a first surface having a dielectric portion, wherein the drain electrode is on the dielectric portion of the first surface of the second substrate, the source electrode is on the dielectric layer of the first substrate, the inner channels of the conducting carbon nanotubes are aligned substantially perpendicular to the dielectric layer of the first substrate, and the gate electrode extends from the first surface of the second substrate through at least a portion of the thickness of the thick film.

13. The gated nanostructure device of claim 12, wherein the gate electrode extends through the thickness of the thick film from the second substrate to the first substrate.

14. The gated nanostructure device of claim 12, wherein the thick film has a circular shape with a diameter from about 0.01 μm to about 1,000 μm in a cross section parallel to the dielectric layer of the first substrate.

15. The gated nanostructure device of claim 12, wherein the first surface of the second substrate faces the dielectric layer of the first substrate.

16. The gated nanostructure device of claim 12, wherein the dielectric layer of the first substrate faces a second surface of the second substrate, which is opposite to the first surface of the second substrate.

17. The gated nanostructure device of claim 12, wherein the gate electrode comprises a plurality of gate elements, each extending from the first surface of the second substrate through at least a portion of the thickness of the thick film.

18. A sensing device comprising the gated nanostructure device of claim 1, wherein the sensing device is configured to detect a chemical species in the outside environment upon exposure of the exposed portion of the conducting carbon nanotubes to the chemical species.

19. A method of detecting a chemical species in an outside environment, comprising:
exposing the conducting carbon nanotubes of the gated nanostructure device of claim 1 to the chemical species to generate an electrical response in the conducting carbon nanotubes; and
modulating the electric current through the conducting carbon nanotubes between the source electrode and the drain electrode by applying a gating voltage to the gate electrode to amplify the electrical response.

20. A gated nanostructure device comprising:
a first substrate comprising a dielectric layer;
a source electrode and a drain electrode, wherein at least one of the source electrode and the drain electrode is on the dielectric layer;
a film comprising conducting carbon nanotubes between the source electrode and the drain electrode, wherein each carbon nanotube has an inner channel; and
a gate electrode inside the inner channel of one or more of the conducting carbon nanotubes.

21. The gated nanostructure device of claim 20, wherein a portion of the conducting carbon nanotubes is exposed to an outside environment.

22. The gated nanostructure device of claim 20, wherein the inner channels of the conducting carbon nanotubes are at least partially aligned along a direction that is substantially parallel to a direction between the source electrode and the drain electrode.

* * * * *